US012575270B2

(12) United States Patent
Lee et al.

(10) Patent No.: US 12,575,270 B2
(45) Date of Patent: Mar. 10, 2026

(54) DISPLAY DEVICE

(71) Applicant: Samsung Display Co., LTD., Yongin-si (KR)

(72) Inventors: Ji Hye Lee, Yongin-si (KR); Kyung Bae Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 386 days.

(21) Appl. No.: 18/454,690

(22) Filed: Aug. 23, 2023

(65) Prior Publication Data

US 2024/0081102 A1 Mar. 7, 2024

(30) Foreign Application Priority Data

Sep. 1, 2022 (KR) ........................ 10-2022-0110700

(51) Int. Cl.
H10K 59/122 (2023.01)
H10K 59/131 (2023.01)
H10K 59/35 (2023.01)

(52) U.S. Cl.
CPC ......... H10K 59/122 (2023.02); H10K 59/131 (2023.02); H10K 59/353 (2023.02)

(58) Field of Classification Search
CPC .. H10K 59/122; H10K 59/131; H10K 59/353; H01L 25/167
See application file for complete search history.

(56) References Cited

U.S. PATENT DOCUMENTS

2017/0179211 A1* 6/2017 Kanaya ................ H10K 59/123
2022/0336708 A1 10/2022 Lee et al.
2023/0146754 A1* 5/2023 Naganuma ........... H10K 59/352
257/40

* cited by examiner

*Primary Examiner* — Changhyun Yi
(74) *Attorney, Agent, or Firm* — Womble Bond Dickinson (US) LLP

(57) ABSTRACT

A display device includes a bank layer defining a first light emitting area, a first electrode in the first light emitting area, a second electrode spaced from the first electrode and around at least a part of the first electrode in the first light emitting area, and a light emitting element between the first electrode and the second electrode. The second electrode includes a first electrode portion, facing a first side surface of the first electrode, forming a first separation space in the first light emitting area, a second electrode portion facing a second side surface of the first electrode, forming a second separation space in the first light emitting area, and a third electrode portion connecting the first electrode portion and the second electrode portion and facing a third side surface of the first electrode, forming a third separation space in the first light emitting area.

20 Claims, 13 Drawing Sheets

NDA

1

DA

DR3
DR1
DR2

SPXn: SPX1, SPX2, SPX3

RME: RME1, RME2
RME1: RME1a, RME1b, RME1c
RME2: RME2a, RME2b, RME2c
CNE: CNEL1, CNEL2
CNEL1: CNE1, CNE3
CNEL2: CNE2, CNE4
CNE2: CNE2a, CNE2b, CNE2c
CNE3: CNE3a, CNE3b, CNE3c
CNE3a: CNE3aa, CNE3ab, CNE3ac
BP: BP1, BP2
BP1: BP1a, BP1b, BP1c
EA: EA1, EA2, EA3
ED: ED1, ED2, ED3
BNL: BNLa, BNLb, BNLc

RME_1: RME1_1, RME2_1
RME1_1: RME1a, RME1b, RME1c_1
RME2_1: RME2a, RME2b, RME2c_1
CNE: CNEL1, CNEL2
CNEL1: CNE1, CNE3
CNEL2: CNE2, CNE4
CNE2: CNE2a, CNE2b, CNE2c
CNE3: CNE3a, CNE3b, CNE3c
CNE3a: CNE3aa, CNE3ab, CNE3ac
BP: BP1, BP2
BP1: BP1a, BP1b, BP1c
EA: EA1, EA2_1, EA3
ED: ED1, ED2, ED3
BNL_1: BNLa, BNLb, BNLc_1

RME_2: RME1_2, RME2
RME1_2: RME1a_2, RME1b_2, RME1c_2
CNE: CNEL1, CNEL2
CNEL1: CNE1, CNE3
CNEL2: CNE2, CNE4

RME_2: RME1_2, RME2
RME1_2: RME1a_2, RME1b_2, RME1c_2
RME2: RME2a, RME2b, RME2c
CNE: CNEL1, CNEL2
CNEL1: CNE1, CNE3
CNEL2: CNE2, CNE4
CNE2: CNE2a, CNE2b, CNE2c
CNE3: CNE3a, CNE3b, CNE3c
CNE3a: CNE3aa, CNE3ab, CNE3ac
BP: BP1, BP2
BP1: BP1a, BP1b, BP1c
EA: EA1, EA2, EA3
ED: ED1, ED2, ED3
BNL: BNLa, BNLb, BNLc

DISPLAY DEVICE

CROSS-REFERENCE TO RELATED APPLICATION

This application claims priority to and the benefit of Korean Patent Application No. 10-2022-0110700 filed on Sep. 1, 2022, in the Korean Intellectual Property Office, the entire content of which is incorporated by reference herein.

BACKGROUND

1. Field

The present disclosure relates to a display device.

2. Description of the Related Art

The importance of display devices has steadily increased with the development of multimedia technology. In response thereto, various types of display devices such as an organic light emitting diode (OLED) display, a liquid crystal display (LCD) and the like have been used.

A display device is a device for displaying an image, and includes a display panel, such as an organic light emitting display panel or a liquid crystal display panel. The light emitting display panel may include light emitting elements, e.g., light emitting diodes (LED), and examples of the light emitting diode include an organic light emitting diode (OLED) using an organic material as a fluorescent material and an inorganic light emitting diode using an inorganic material as a fluorescent material.

An inorganic light emitting diode using an inorganic semiconductor as a fluorescent material has an advantage in that it has durability even in a high temperature environment, and has higher efficiency of blue light than an organic light emitting diode.

SUMMARY

Aspects and features of embodiments of the present disclosure provide a display device in which light emitting elements disposed in pixels are uniformly arranged and therefore luminance is improved.

However, aspects and features of embodiments of the present disclosure are not restricted to those set forth herein. The above and other aspects of the present disclosure will become more apparent to one of ordinary skill in the art to which the present disclosure pertains by referencing the detailed description of the present disclosure given below.

According to one or more embodiments of the present disclosure, a display device includes a bank layer defining a first light emitting area, a first electrode in the first light emitting area, a second electrode spaced from the first electrode and around at least a part of the first electrode in the first light emitting area, and a light emitting element in a space between the first electrode and the second electrode. The second electrode includes a first electrode portion facing a first side surface of the first electrode and forming a first separation space in the first light emitting area, a second electrode portion facing a second side surface of the first electrode and forming a second separation space in the first light emitting area, and a third electrode portion connecting the first electrode portion and the second electrode portion and facing a third side surface of the first electrode and forming a third separation space in the first light emitting area. The bank layer includes a first surface opposing the first side surface of the first electrode, a second surface opposing the second side surface of the first electrode, and a third surface connecting the first surface and the second surface of the bank layer and opposing the third surface of the first electrode. A linear distance between the first separation space and the first surface of the bank layer, a linear distance between the second separation space and the second surface of the bank layer, and a linear distance between the third separation space and the third surface of the bank layer are the same.

Each of the linear distance between the first separation space and the first surface of the bank layer, the linear distance between the second separation space and the second surface of the bank layer, and the linear distance between the third separation space and the third surface of the bank layer may be 5 μm or more.

The display device may further include a connection electrode on the light emitting element. The light emitting element may include a first light emitting element, a second light emitting element, and a third light emitting element each of the first light emitting element, the second light emitting element, and the third light emitting element including a first end portion having a first polarity and a second end portion opposite the first end portion and having a second polarity different from the first polarity. The connection electrode may include a first connection electrode in contact with the first end portion of the first light emitting element, a second connection electrode in contact with the second end portion of the first light emitting element and the first end portion of the second light emitting element, a third connection electrode in contact with the second end portion of the second light emitting element and the first end portion of the third light emitting element, and a fourth connection electrode in contact with the second end portion of the third light emitting element.

The first connection electrode is configured to receive a first power voltage. The fourth connection electrode is configured to receive a second power voltage having a different potential value from the first power voltage.

The first connection electrode may be on the first electrode. The fourth connection electrode may be on the second electrode portion of the second electrode. The second connection electrode may include a first portion on the first electrode portion of the second electrode and facing the first connection electrode, a second portion on the first electrode, and a connection portion connecting the first portion and the second portion. The third connection electrode may include a first portion around the second portion of the second connection electrode, a second portion on the first electrode and facing the fourth connection electrode, and a connection portion connecting the first portion and the second portion.

The second end portion of the first light emitting element may be in contact with the first portion of the second connection electrode. The first end portion of the second light emitting element may be in contact with the second portion of the second connection electrode. The second end portion of the second light emitting element may be in contact with the first portion of the third connection electrode. The first end portion of the third light emitting element may be in contact with the second portion of the third connection electrode.

The bank layer may further define a second light emitting area at one side of the first light emitting area. The first electrode portion of the second electrode in the first light emitting area may extend to the second light emitting area.

The bank layer may further define a third light emitting area at an other side of the first light emitting area. The second electrode portion of the second electrode in the first light emitting area may extend to the third light emitting area.

The first electrode portion of the second electrode may further include a through hole between the first light emitting area and the second light emitting area and penetrating the first electrode portion of the second electrode. The second electrode portion may further include a through hole between the first light emitting area and the third light emitting area and penetrating the second electrode portion.

According to one or more embodiments of the present disclosure, a display device includes a bank layer defining a light emitting area, a first electrode in the light emitting area and including a first side surface, a second side surface, and a third side surface connecting the first side surface and the second side surface, a second electrode spaced from the first electrode in the light emitting area to be around the first side surface, the second side surface, and the third side surface of the first electrode, a first light emitting element, a second light emitting element, and a third light emitting element between the first electrode and the second electrode, each of the first light emitting element, the second light emitting element, and the third light emitting element including a first end portion having a first polarity and a second end portion opposite side of the first end portion and having a second polarity different from the first polarity, and a connection electrode on the first light emitting element, the second light emitting element, and the third light emitting element. The connection electrode includes a first connection electrode in contact with the first end portion of the first light emitting element, a second connection electrode in contact with the second end portion of the first light emitting element and the first end portion of the second light emitting element, a third connection electrode in contact with the second end portion of the second light emitting element and the first end portion of the third light emitting element, and a fourth connection electrode in contact with the second end portion of the third light emitting element.

The first connection electrode is configured to receive a first power voltage. The fourth connection electrode is configured to receive a second power voltage having a different potential value from the first power voltage.

The first connection electrode may be on the first side surface of the first electrode. The fourth connection electrode may be on the second electrode. The second connection electrode may include a first portion on the second electrode and facing the first connection electrode, a second portion on the first electrode, and a connection portion connecting the first portion and the second portion of the second connection electrode. The third connection electrode may include a first portion around the second portion of the second connection electrode, a second portion on the second side surface of the first electrode and facing the fourth connection electrode, and a connection portion connecting the first portion and the second portion of the third connection electrode.

The second end portion of the first light emitting element may be in contact with the first portion of the second connection electrode. The first end portion of the second light emitting element may be in contact with the second portion of the second connection electrode. The second end portion of the second light emitting element may be in contact with the first portion of the third connection electrode. The first end portion of the third light emitting element may be in contact with the second portion of the third connection electrode.

The connection portion of the second connection electrode may be between the first light emitting element and the second light emitting element. The connection portion of the third connection electrode may be between the second light emitting element and the third light emitting element.

A width of the second portion of the second connection electrode may be greater than a width of the first portion of the first electrode.

The second portion of the second connection electrode completely may cover the third side surface of the first electrode and may cover at least a part of the first side surface and the second side surface of the first electrode.

The third connection electrode may include a first extension portion of the first portion facing the first side surface of the first electrode in a portion of the first electrode overlapping the second portion of the second connection electrode, a second extension portion of the first portion facing the second side surface of the first electrode, and a third extension portion of the first portion facing the third side surface of the first electrode.

The second electrode may include a first electrode portion adjacent to the first side surface of the first electrode in the light emitting area and forming a first separation space, a second electrode portion adjacent to the second side surface of the first electrode in the light emitting area and forming a second separation space, and a third electrode portion adjacent to the third side surface of the first electrode in the light emitting area and forming a third separation space.

The bank layer may include first surface opposing the first side surface of the first electrode, a second surface opposing the second surface of the first electrode, and a third surface opposing the third surface of the first electrode. A linear distance between the first separation space and the first surface of the bank layer, a linear distance between the second separation space and the second surface of the bank layer, and a linear distance between the third separation space and the third surface of the bank layer may be the same.

Each of the linear distance between the first separation space and the first surface of the bank layer, the linear distance between the second separation space and the second surface of the bank layer, and the linear distance between the third separation space and the third surface of the bank layer may be 5 μm or more.

According to the display device according to one embodiment, light emitting elements disposed in pixels are uniformly arranged and luminance is improved.

However, the effects of the present disclosure are not limited to the aforementioned effects, and various other effects are included in the present disclosure.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
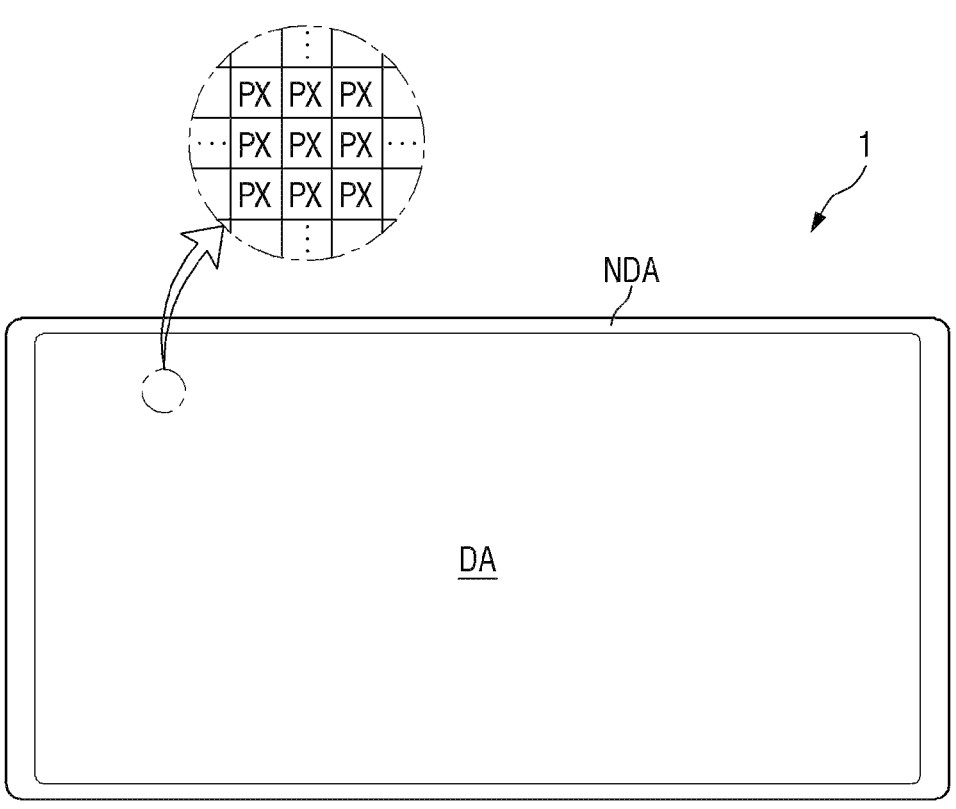
FIG. 1 is a schematic plan view of a display device according to one or more embodiments.
Figure 1:
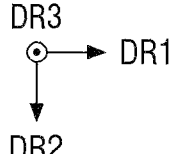

In the following description, for the purposes of explanation, numerous specific details are set forth in order to provide a thorough understanding of various embodiments or implementations of the present disclosure. As used herein "embodiments" and "implementations" are interchangeable words that are non-limiting examples of devices or methods employing one or more embodiments of the present disclosure. It is apparent, however, that various embodiments may be practiced without these specific details or with one or more equivalent arrangements. In other instances, structures and devices are shown in block diagram form in order to avoid unnecessarily obscuring various embodiments. Further, various embodiments may be different, but do not have to be exclusive nor limit the present disclosure. For example, specific shapes, configurations, and characteristics of an embodiment may be used or implemented in other embodiments without departing from the scope of the present disclosure.

Unless otherwise specified, the illustrated embodiments are to be understood as providing features of varying detail of some ways in which the present disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the present disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X, Y, and Z-axes may be interpreted in a broader sense. For example, the X-axis, the Y-axis, and the Z-axis may be perpendicular to one another, or may represent different directions that are not perpendicular to one another.

For the purposes of the present disclosure, "at least one of X, Y, and Z," "at least one selected from the group consisting of X, Y, and Z," at least one of "X, Y, or Z," and "at least one selected from among X, Y, and Z" may be construed as X only, Y only, Z only, or any combination of two or more of X, Y, and Z, such as, for instance, XYZ, XYY, YZ, ZZ, or the like. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the present disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

One or more embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and, as such, are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the present disclosure. Further, the blocks, units, parts, and/or modules of some embodiments may be physically combined into more complex blocks, units, parts, and/or modules without departing from the scope of the present disclosure.

Unless otherwise defined or implied herein, all terms (including technical and scientific terms) used herein have the same meaning as commonly understood by those skilled in the art to which the present disclosure pertains. It will be further understood that terms, such as those defined in commonly used dictionaries, should be interpreted as having a meaning that is consistent with their meaning in the context of the relevant art and the present disclosure, and should not be interpreted in an ideal or excessively formal sense unless clearly so defined herein.

Hereinafter, detailed embodiments of the present disclosure is described with reference to the accompanying drawings.

FIG. 1 is a schematic plan view of a display device according to one or more embodiments.

A first direction DR1, a second direction DR2, and a third direction DR3 are defined as shown in FIG. 1. The first direction DR1 and the second direction DR2 may be perpendicular to each other, the first direction DR1 and the third direction DR3 may be perpendicular to each other, and the second direction DR2 and the third direction DR3 may be perpendicular to each other. It may be understood that the first direction DR1 refers to a horizontal direction in the drawing, the second direction DR2 refers to a vertical direction in the drawing, and the third direction DR3 refers to an upward and downward direction (i.e., a thickness direction) in the drawing.

In the following specification, unless otherwise stated, "direction" may refer to both directions extending along the direction. Further, when it is necessary to distinguish both "directions" extending in both sides, one side will be referred to as "one side in the direction" and the other side will be referred to as "the other side in the direction." Referring to FIG. 1, a direction in which an arrow is directed is referred to as one side, and the opposite direction is referred to as the other side.

Hereinafter, for simplicity of description, in referring to a display device 1 or the surfaces of each member constituting the display device 1, one surface facing one side in the direction in which an image is displayed, i.e., the third direction DR3, is referred to as a top surface, and the opposite surface to the one surface is referred to as a bottom surface. However, the present disclosure is not limited thereto, and the one surface and the other surface of the member may be referred to as a front surface and a rear surface, respectively, or may be referred to as a first surface or a second surface, respectively. Further, in describing the relative position of each member of the display device 1, one side in the third direction DR3 may be referred to as an upper side and the other side in the third direction DR3 may be referred to as a lower side.

Referring to FIG. 1, a display device 1 displays a moving image or a still image. The display device 1 may refer to any electronic device providing a display screen. Examples of the display device 1 may include a television, a laptop computer, a monitor, a billboard, an Internet-of-Things (IoT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 1 includes a display panel that provides a display screen. Examples of the display panel may include an inorganic light emitting diode display panel, an organic light emitting display panel, a quantum dot light emitting display panel, a plasma display panel, and a field emission display panel. In the following description, a case where an inorganic light emitting diode display panel is applied as a display panel will be exemplified, but the present disclosure is not limited thereto, and other display panels may be applied within the same scope of technical spirit.

The shape of the display device 1 may be variously modified. For example, the display device 1 may have a shape such as a rectangular shape elongated in a horizontal direction, a rectangular shape elongated in a vertical direction, a square shape, a quadrilateral shape with rounded corners (vertices), other polygonal shapes and a circular shape. The shape of a display area DA of the display device 1 may also be similar to the overall shape of the display device 1. FIG. 1 illustrates the display device 1 having a rectangular shape elongated in a second direction DR2.

The display device 1 may include the display area DA and a non-display area NDA. The display area DA is an area where an image can be displayed, and the non-display area NDA is an area where no image is displayed. The display area DA may also be referred to as an active region, and the non-display area NDA may also be referred to as a non-active region. The display area DA may substantially occupy the center (or a central region) of the display device 1.

The display area DA may include a plurality of pixels PX. The plurality of pixels PX may be arranged in a matrix. The shape of each pixel PX may be a rectangular or square shape in a plan view. However, the present disclosure is not limited thereto, and it may be a rhombic shape in which each side is inclined with respect to one direction. The pixels PX may be arranged in a stripe type or an island type. In addition, each of the pixels PX may include one or more light emitting elements that emit light of a specific wavelength band to display a specific color.

The non-display area NDA may be disposed around the display area DA along an edge or periphery of the display area DA. The non-display area NDA may completely or partially surround the display area DA. The display area DA may have a rectangular shape, and the non-display area NDA may be disposed adjacent to four sides of the display area DA. The non-display area NDA may form a bezel of the display device 1. Wires or circuit drivers included in the display device 1 may be disposed in the non-display area NDA, or external devices may be mounted thereon.

Figure 2:
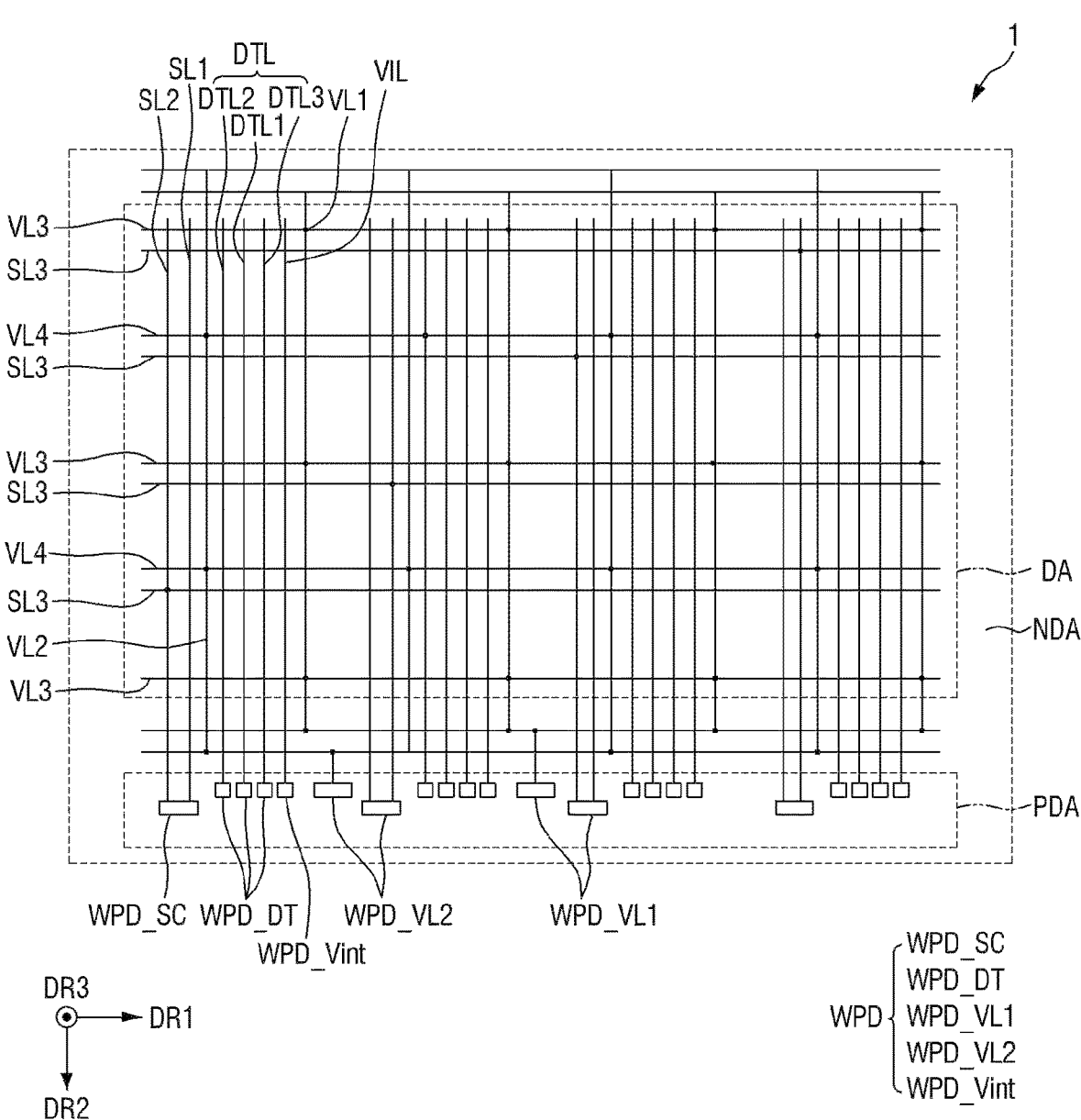
FIG. 2 is a schematic layout view illustrating a plurality of wires of a display device according to one or more embodiments.

FIG. 2 is a schematic layout view illustrating a plurality of wires of a display device according to one or more embodiments.

Referring to FIG. 2, the display device 1 may include a plurality of wires. The display device 1 may include a plurality of scan lines SL (SL1, SL2, and SL3), a plurality of data lines DTL (DTL1, DTL2, and DTL3), an initialization voltage line VIL, and a plurality of voltage lines VL (VL1, VL2, VL3, and VL4). In one or more embodiments, other wires may be further provided in the display device 1. The plurality of wires may include wires formed of a first conductive layer and extending in a first direction DR1, and wires formed of a third conductive layer and extending in the second direction DR2. However, the extension directions of the wires are not limited thereto.

The first scan line SL1 and the second scan line SL2 may be disposed to extend in the second direction DR2. The first scan line SL1 and the second scan line SL2 may be disposed adjacent to each other, and may be disposed to be spaced from the different first scan line SL1 and second scan line SL2 in the first direction DR1. The first scan line SL1 and the second scan line SL2 may be connected to a scan line pad WPD_SC connected to a scan driver. The first scan line SL1 and the second scan line SL2 may be disposed to extend from the pad area PDA disposed in the non-display area NDA to the display area DA.

A third scan line SL3 may be disposed to extend in the first direction DR1, and may be disposed to be spaced from the other third scan line SL3 in the second direction DR2. One third scan line SL3 may be connected to one or more first scan lines SL1 or one or more second scan lines SL2. The plurality of scan lines SL may have a mesh structure in the entire surface of the display area DA, but is not limited thereto.

In one or more embodiments, the term "connected" as used herein may mean not only that one member is connected to another member through a physical contact, but also that one member is connected to another member through yet another member. This may also be understood as one part and the other part as integral elements are connected into an integrated element via another element. Furthermore, if one element is connected to another element, this may be construed as a meaning including an electrical connection via another element in addition to a direct connection in physical contact.

The data lines DTL may be disposed to extend in the second direction DR2. The data line DTL includes a first data line DTL1, a second data line DTL2, and a third data line DTL3, and each one of the first to third data lines DTL1, DTL2, and DTL3 forms a pair and is disposed adjacent to each other. Each of the data lines DTL1, DTL2, and DTL3 may be disposed to extend from the pad area PDA disposed in the non-display area NDA to the display area DA. However, the present disclosure is not limited thereto, and the plurality of data lines DTL may be spaced from each other at equal intervals between a first voltage line VL1 and a second voltage line VL2 to be described later.

The initialization voltage line VIL may be disposed to extend in the second direction DR2. The initialization voltage line VIL may be disposed between the data lines DTL and the first voltage line VL1. The initialization voltage line VIL may be disposed to extend from the pad area PDA disposed in the non-display area NDA to the display area DA.

The first voltage line VL1 and the second voltage line VL2 are disposed to extend in the second direction DR2, and a third voltage line VL3 and a fourth voltage line VL4 are disposed to extend in the first direction DR1. The first voltage line VL1 and the second voltage line VL2 may be alternately arranged along the first direction DR1, and the third voltage line VL3 and the fourth voltage line VL4 may be alternately arranged along the second direction DR2. The first voltage line VL1 and the second voltage line VL2 may be disposed to extend in the second direction DR2 to cross the display area DA, and as for the third voltage line VL3 and the fourth voltage line VL4, some of the wires may be disposed in the display area DA and other wires may be disposed in the non-display area NDA positioned on both sides of the display area DA in the first direction DR1, respectively. The first voltage line VL1 and the second voltage line VL2 may be formed of the first conductive layer, and the third voltage line VL3 and the fourth voltage line VL4 may be formed of the third conductive layer disposed on a layer different from the first conductive layer. The first voltage line VL1 may be connected to at least one third voltage line VL3, the second voltage line VL2 may be connected to at least one fourth voltage line VL4, and the plurality of voltage lines VL may have a mesh structure in the entire display area DA. However, the present disclosure is not limited thereto.

The first scan line SL1, the second scan line SL2, the data line DTL, the initialization voltage line VIL, the first voltage line VL1, and the second voltage line VL2 may be electrically connected to at least one line pad WPD. Each line pad WPD may be disposed in the non-display area NDA. In one or more embodiments, each of the line pads WPD may be disposed in the pad area PDA positioned on the lower side, which is the other side of the display area DA in the first direction DR1. The first scan line SL1 and the second scan line SL2 are connected to the scan line pad WPD_SC disposed in the pad area PDA, and the plurality of data lines DTL are connected to the data line pads WPD_DT different from each other, respectively. The initialization voltage line VIL is connected to an initialization line pad WPD_Vint, the first voltage line VL1 is connected to a first voltage line pad WPD_VL1, and the second voltage line VL2 is connected to a second voltage line pad WPD_VL2. The external devices may be mounted on the line pads WPD. The external devices may be mounted on the line pads WPD by applying an anisotropic conductive film, ultrasonic bonding or the like. The drawing illustrates that each of the line pads WPD is disposed on the pad area PDA disposed on the lower side of the display area DA, but is not limited thereto. Some of the plurality of line pads WPD may be disposed in any one area on the upper side or on the left and right sides of the display area DA.

Each pixel PX or sub-pixel SPXn (n is an integer of 1 to 3) of the display device 1 includes a pixel driving circuit.

The above-described wires may pass through each pixel PX or the vicinity thereof to apply a driving signal to each pixel driving circuit. The pixel driving circuit may include transistors and capacitors. The number of the transistors and the capacitors of each pixel driving circuit may be variously modified. According to one or more embodiments, in each sub-pixel SPXn of the display device 1, the pixel driving circuit may have a 3T1C structure including three transistors and one capacitor. Hereinafter, the pixel driving circuit of the 3T1C structure will be described as an example, but the present disclosure is not limited thereto, and various other modified structures such as a 2T1C structure, a 7T1C structure, and a 6T1C structure may be applied.

Figure 3:
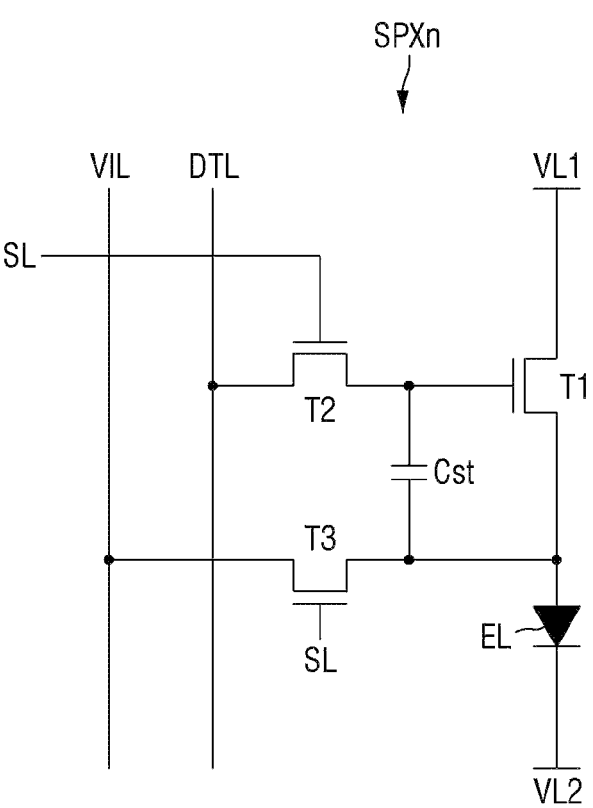
FIG. 3 is an equivalent circuit diagram of one sub-pixel of a display device according to one or more embodiments.

FIG. 3 is a pixel circuit diagram of a display device according to one or more embodiments.

Referring to FIG. 3, each sub-pixel SPXn of the display device 1 according to one or more embodiments includes three transistors T1, T2, and T3 and one storage capacitor Cst in addition to a light emitting diode EL.

The light emitting diode EL emits light by a current supplied through a first transistor T1. The light emitting diode EL includes a first electrode, a second electrode, and at least one light emitting element disposed between them. The light emitting element may emit light of a specific wavelength band by electrical signals transmitted from the first electrode and the second electrode.

One end of the light emitting diode EL may be connected to the source electrode of the first transistor T1, and the other end thereof may be connected to the second voltage line VL2 to which a low potential voltage (hereinafter, a second power voltage) lower than a high potential voltage (hereinafter, a first power voltage) of the first voltage line VL1 is supplied.

The first transistor T1 adjusts a current flowing from the first voltage line VL1, to which the first power voltage is supplied, to the light emitting diode EL according to the voltage difference between the gate electrode and the source electrode of the first transistor T1. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the first voltage line VL1 to which the first power voltage is applied.

The second transistor T2 is turned on by a scan signal of the scan line SL to connect the data line DTL to the gate electrode of the first transistor T1. The gate electrode of the second transistor T2 may be connected to the scan line SL, the source electrode thereof may be connected to the gate electrode of the first transistor T1, and the drain electrode thereof may be connected to the data line DTL.

The third transistor T3 is turned on by a scan signal of the scan line SL to connect the initialization voltage line VIL to one end of the light emitting diode EL. The gate electrode of the third transistor T3 may be connected to the scan line SL, the drain electrode thereof may be connected to the initialization voltage line VIL, and the source electrode thereof may be connected to one end of the light emitting diode EL or to the source electrode of the first transistor T1.

In one or more embodiments, the source electrode and the drain electrode of each of the transistors T1, T2, and T3 are not limited to those described above, and vice versa. Each of the transistors T1, T2, and T3 may be formed of a thin film transistor (TFT). In FIG. 3, each of the transistors T1, T2, and T3 has been described as being formed of an N-type metal oxide semiconductor field effect transistor (MOSFET), but is not limited thereto. For example, each of the transistors T1, T2, and T3 may be formed of a P-type MOSFET. Alternatively, some of the transistors T1, T2, and T3 may be formed of an N-type MOSFET and the others may be formed of a P-type MOSFET.

The storage capacitor Cst is formed between the gate electrode and the source electrode of the first transistor T1. The storage capacitor Cst stores a difference voltage between a gate voltage and a source voltage of the first transistor T1.

In the embodiment of FIG. 3, the gate electrode of the second transistor T2 may be connected to the scan line SL1 (e.g., see FIG. 2), and the gate electrode of the third transistor T3 may be connected to the scan line SL2 (e.g., see FIG. 2). In other words, the second transistor T2 and the third transistor T3 may be turned on in response to a scan signal applied from the same scan line. However, the present disclosure is not limited thereto, and the second transistor T2 and the third transistor T3 may be connected to different scan lines to be turned on in response to scan signals applied from different scan lines.

Hereinafter, a structure of the pixel PX of the display device 1 according to one or more embodiments will be described.

Figure 4:
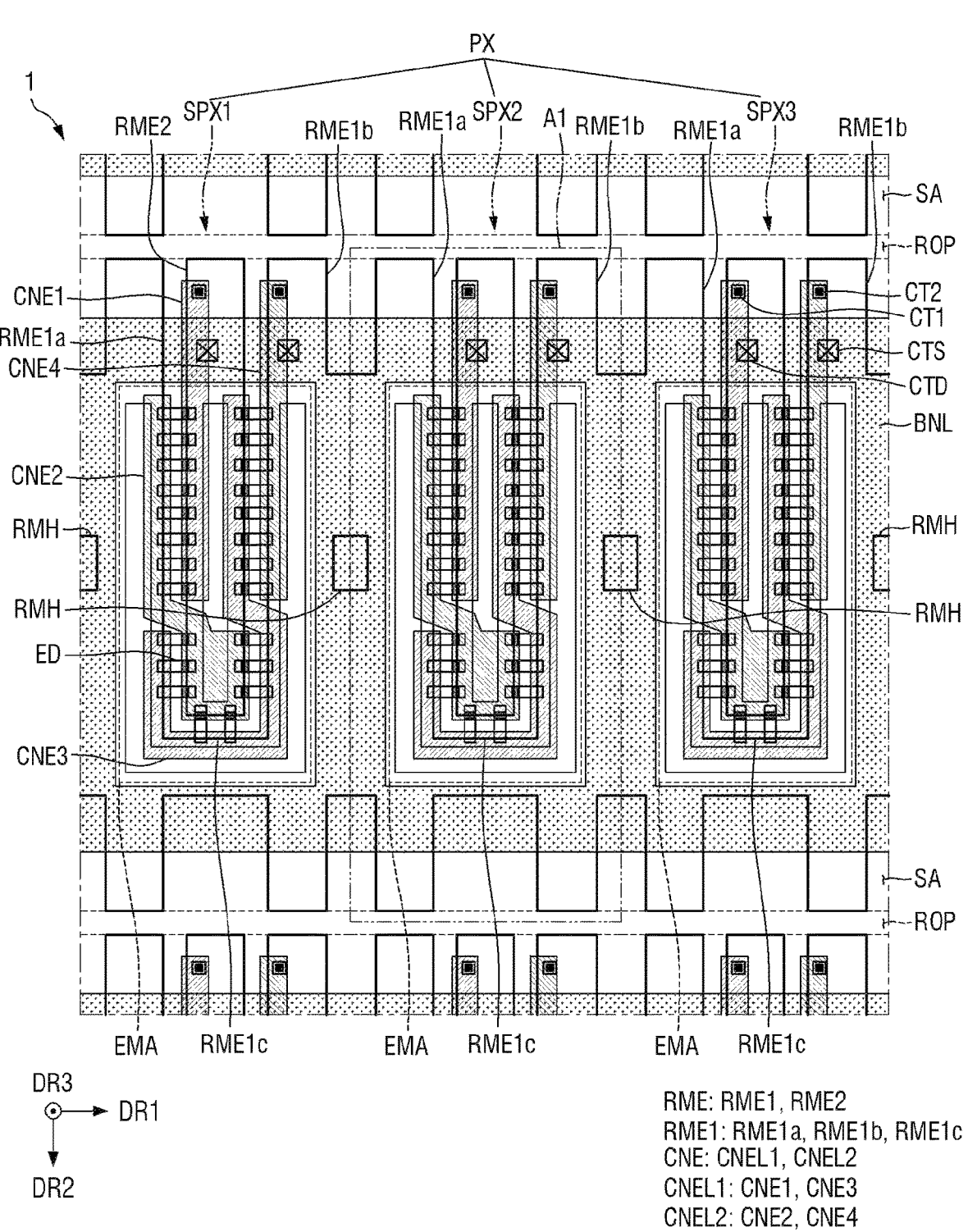
FIG. 4 is a plan view illustrating a structure of a pixel of a display device according to one or more embodiments.
Figure 5:
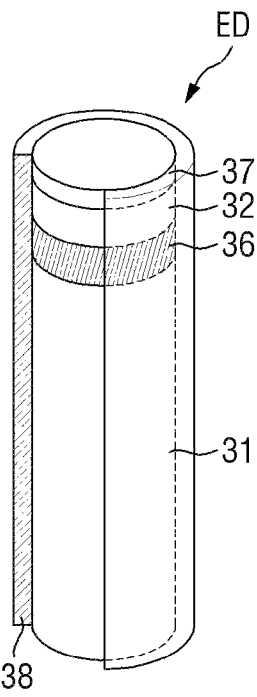
FIG. 5 is a perspective cutaway view illustrating a structure of a light emitting element of FIG. 4.
Figure 6:
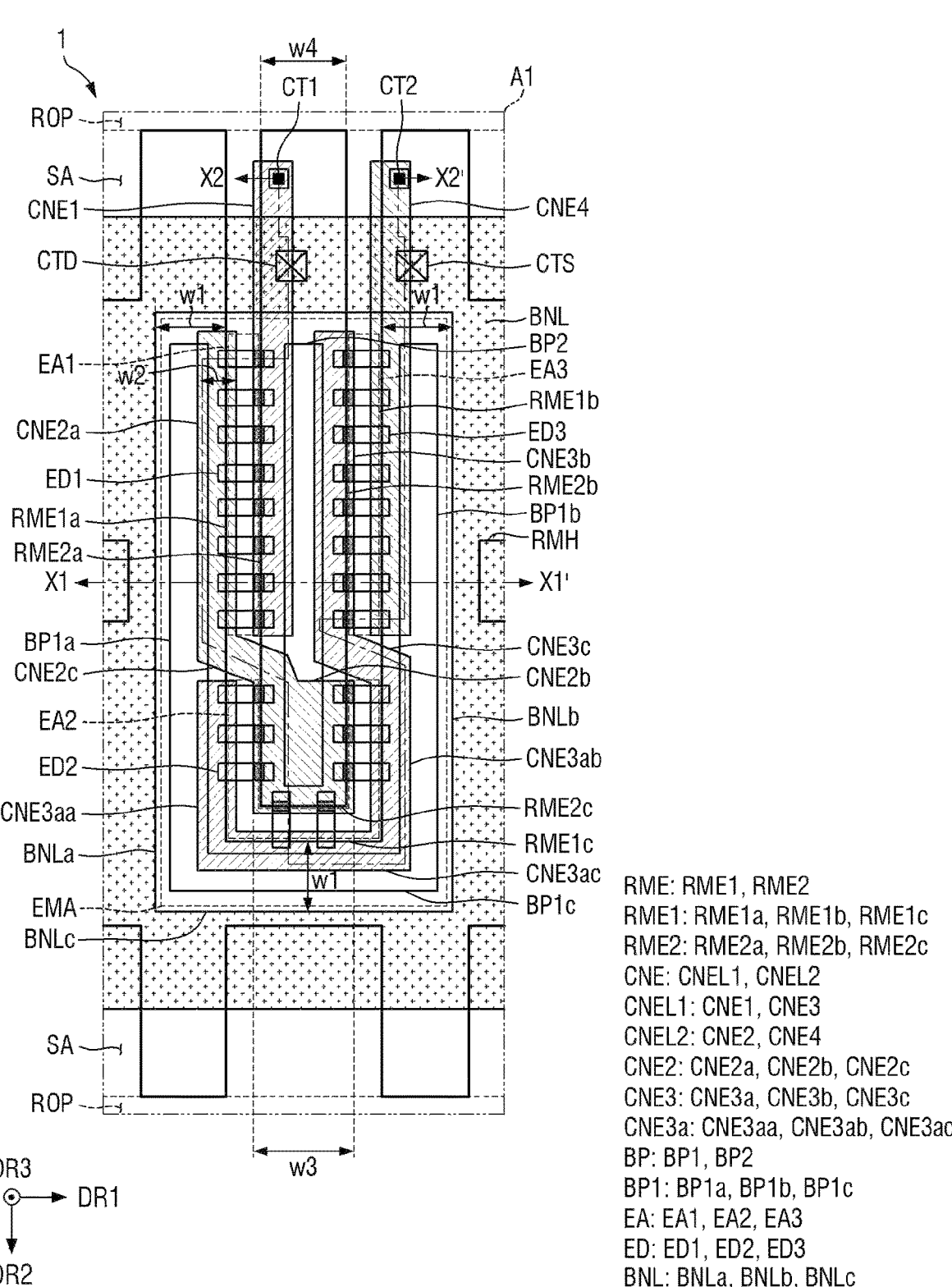
FIG. 6 is an enlarged view of an area A1 of FIG. 4.

FIG. 4 is a plan view illustrating a structure of a pixel of a display device according to one or more embodiments. FIG. 5 is a perspective cutaway view illustrating a structure of a light emitting element of FIG. 4. FIG. 6 is an enlarged view of an area A1 of FIG. 4.

FIGS. 4 and 6 illustrate a planar disposition of alignment electrodes RME, an outer bank BNL, a plurality of light emitting elements ED, and a connection electrode CNE disposed in one pixel PX of the display device 1.

Referring to FIGS. 4 and 6, each of the pixels PX of the display device 1 may include a plurality of sub-pixels SPXn. For example, one pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the present disclosure is not limited thereto, and the sub-pixels SPXn may emit light of the same color. In one or more embodiments, each of the sub-pixels SPXn may emit blue light. Although it is illustrated in the drawing that one pixel PX includes three sub-pixels SPXn, the present disclosure is not limited thereto, and the pixel PX may include a larger number of sub-pixels SPXn. Hereinafter, for simplicity of description, one pixel PX will be mainly described as including three sub-pixels SPXn.

The first sub-pixel SPX1, the second sub-pixel SPX2, and the third sub-pixel SPX3 may be arranged sequentially along the first direction DR1. For example, the first sub-pixel SPX1 may be disposed on one side of the third sub-pixel SPX3 in the first direction DR1.

Accordingly, a pixel PX and at least one of the sub-pixels SPXn the pixel PX may be adjacent to at least one of the sub-pixels SPXn of another pixel PX adjacent to the pixel PX. For example, with reference to FIG. 4, the third sub-pixel SPX3 of the pixel PX disposed on the opposite in the first direction DR1 may be adjacent to the first sub-pixel SPX1 of another pixel PX adjacent to the pixel PX on one side in the first direction DR1.

Each of the sub-pixels SPXn of the display device 1 may include an emission area EMA and a non-emission area. In the emission area EMA, the light emitting elements ED are disposed to emit light of a particular wavelength band. In the non-emission area, the light emitting elements ED are not disposed and the lights emitted from the light emitting elements ED do not reach, and thus no light exits therefrom.

The emission area EMA may be defined by an outer bank BNL. In other words, the emission area EMA may be the space surrounded by the outer bank BNL. The emission area EMA may have a rectangular shape including short sides in the first direction DR1 and long sides in the second direction DR2 in a plan view. For example, the outer bank BNL may include a first surface BNLa defining the other side surface of the emission area EMA in the first direction DR1 as a long side in the second direction DR2, a second surface BNLb defining one side surface of the emission area EMA in the first direction DR1 as a long side in the second direction DR2, a third surface BNLc defining one side surface of the emission area EMA in the second direction DR2 as a short side in the first direction DR1, and a fourth surface defining the other side surface of the emission area EMA in the second direction DR2 as a short side in the first direction DR1.

The emission area EMA may include a region in which the light emitting element ED is disposed, and a region adjacent to the light emitting element ED and from which lights emitted from the light emitting element ED are emitted. For example, the emission area EMA may further include a region in which the light emitted from the light emitting element ED is reflected or refracted by another member and emitted. The plurality of light emitting elements ED may be disposed in each sub-pixel SPXn, and the emission area may be formed to include an area where the light emitting elements ED are disposed and an area adjacent thereto.

Although it is shown in the drawing that the sub-pixels SPXn have the emission areas EMA that are substantially identical in size, the present disclosure is not limited thereto. In one or more embodiments, the emission areas EMA of the sub-pixels SPXn may have different sizes according to a color or wavelength band of light emitted from the light emitting element ED disposed in each sub-pixel SPXn. In one or more embodiments, the width of the emission area EMA in the first direction DR1 may be approximately 74 μm, but is not limited thereto.

Each sub-pixel SPXn may further include a sub-region SA disposed in the non-emission area. The sub-region SA may be a divided area according to the disposition of the alignment electrodes RME. The sub-region SA may be disposed on one side and the other side in the second direction DR2 in the emission area EMA. The emission areas EMA corresponding to sub-pixels SPX1, SPX2, and SPX3 may be alternately arranged along the first direction DR1, and the sub-region SA may extend in the first direction DR1. Each of a plurality of emission areas EMA and the sub-regions SA may be repeatedly arranged along the second direction DR2. Each of the plurality of emission areas EMA may be disposed between the sub-regions SA.

The sub-region SA may be a region shared by the sub-pixels SPXn adjacent to each other in the first direction DR1. For example, the first sub-pixel SPX1, the second sub-pixel SPX2, and the third sub-pixel SPX3 may share the sub-region SA. In addition, the sub-region SA may be a region shared by the sub-pixels SPXn adjacent to each other in the second direction DR2. For example, the sub-regions SA disposed on both sides of the outer bank BNL in the second direction DR2 illustrated in FIG. 4 may be shared by the sub-pixel SPXn illustrated in the drawing and the sub-pixels SPXn not illustrated in the drawing and adjacent to each other in the second direction DR2.

Light may not be emitted from the sub-region SA because the light emitting element ED is not disposed in the sub-region SA, but an alignment electrode RME disposed in each sub-pixel SPXn may be partially disposed in the sub-region SA. The alignment electrodes RME disposed in different sub-pixels SPXn may be disposed to be separated at a separation portion ROP of the sub-region SA.

The alignment electrode RME may include a second alignment electrode RME2 disposed in each sub-pixel SPXn and a first alignment electrode RME1 integrally formed beyond the adjacent sub-pixel SPXn. The first alignment electrode RME1 and the second alignment electrode RME2 are spaced from each other.

The second alignment electrode RME2 may have a bar shape substantially extending in the second direction DR2 in a plan view. The second alignment electrode RME2 may be disposed in a central portion of the emission area EMA of each sub-pixel SPXn. The second alignment electrode RME2 may be electrically connected to a circuit element layer CCL (refer to FIGS. 7 and 8) to be described later through a first electrode contact hole CTD to receive a first power voltage.

The second alignment electrode RME2 may have a rectangular shape in a plan view. For example, the second alignment electrode RME2 may include a first side surface RME2a that is the other side surface in the first direction DR1, a second side surface RME2b that is one side surface in the first direction DR1, and a third side surface RME2c that is one side surface in the second direction DR2 and a fourth side surface that is the other side surface in the second direction DR2. In one or more embodiments, the lengths of the first side surface RME2a and the second side surface RME2b may be greater than the lengths of the third side surface RME2c and the fourth side surface, but the present disclosure is not limited thereto.

The fourth side surface of the second alignment electrode RME2 may be in contact with the separation portion ROP, and the first side surface RME2a, the second side surface RME2b, and the third side surface RME2c may be surrounded by the first alignment electrode RME1.

The first alignment electrode RME1 may have a U-shape surrounding the second alignment electrode RME2 in the emission area EMA of each sub-pixel SPXn. The first alignment electrode RME1 may be electrically connected to the circuit element layer CCL (refer to FIGS. 7 and 8) to be described later through a second electrode contact hole CTS. The first alignment electrode RME1 may receive the above-described second power voltage through the second electrode contact hole CTS.

In one or more embodiments, the first electrode contact hole CTD and the second electrode contact hole CTS may not overlap the emission area EMA. In some embodiments, the first electrode contact hole CTD and the second electrode contact hole CTS may be disposed to overlap the outer bank BNL, but are not limited thereto. For example, the first electrode contact hole CTD and the second electrode contact hole CTS may be disposed on the sub-region SA. FIGS. 4 and 6 illustrate that the first electrode contact hole CTD and the second electrode contact hole CTS overlap the outer bank BNL.

The first alignment electrode RME1 may include a first electrode portion RME1a, a second electrode portion RME1b, and a third electrode portion RME1c. The first electrode portion RME1a, the second electrode portion RME1b, and the third electrode portion RME1c may be integrally formed as a part of the first alignment electrode RME1 to form the first alignment electrode RME1.

For example, as illustrated in FIG. 6, the first alignment electrode RME1 may include the first electrode portion RME1$a$ located on the other side of the emission area EMA in the first direction DR1 to face the first side surface RME2$a$ of the second alignment electrode RME2, the second electrode portion RME1$b$ located on the one side of the emission area EMA in the first direction DR1 to face the second side surface RME2$b$ of the second alignment electrode RME2, and the third electrode portion RME1$c$ located on the one side of the emission area EMA in the second direction DR2 to connect the first electrode portion RME1$a$ and the second electrode portion RME1$b$ and face the third side surface RME2$c$ of the second alignment electrode RME2.

The first electrode portion RME1$a$ of the first alignment electrode RME1 may have a shape substantially extending in the second direction DR2 from the emission area EMA. The first electrode portion RME1$a$ may be spaced from the first side surface RME2$a$ of the second alignment electrode RME2 in the first direction DR1. In one or more embodiments, the first electrode portion RME1$a$ may extend to the sub-region SA, passing the emission area EMA, but is not limited thereto.

The second electrode portion RME1$b$ of the first alignment electrode RME1 may have a shape substantially extending in the second direction DR2 from the emission area EMA. The second electrode portion RME1$b$ may be spaced from the first electrode portion RME1$a$ in the first direction DR1. The second electrode portion RME1$b$ may be spaced from the second side surface RME2$b$ of the second alignment electrode RME2 in the first direction DR1. In one or more embodiments, the second electrode portion RME1$b$ may extend to the sub-region SA, passing the emission area EMA, but is not limited thereto.

The third electrode portion RME1$c$ of the first alignment electrode RME1 may have a shape substantially extending in the first direction DR1 from the emission area EMA. The third electrode portion RME1$c$ may connect the first electrode portion RME1$a$ and the second electrode portion RME1$b$. The third electrode portion RME1$c$ may be spaced from the third side surface RME2$c$ of the second alignment electrode RME2 in the second direction DR2.

The first electrode portion RME1$a$ of one sub-pixel SPXn may be integrally formed with the second electrode portion RME1$b$ of the sub-pixel SPXn adjacent thereto. For example, as illustrated in FIG. 4, the first electrode portion RME1$a$ of the second sub-pixel SPX2 may extend beyond the emission area EMA of the second sub-pixel SPX2 in the other side of the first direction DR1 to be integrally formed with the second electrode portion RME1$b$ of the first sub-pixel SPX1, and the second electrode portion RME1$b$ of the second sub-pixel SPX2 may extend beyond the emission area EMA of the second sub-pixel SPX2 in the one side of the first direction DR1 to be integrally formed with the first electrode portion RME1$a$ of the third sub-pixel SPX3.

A portion where the first electrode portion RME1$a$ of one sub-pixel SPXn and the second electrode portion RME1$b$ of the sub-pixel SPXn adjacent thereto are connected may include a through hole RMH passing therethrough. The through hole RMH may overlap the outer bank BNL in the third direction DR3 and may not overlap the emission areas EMA. As will be described later, the through hole RMH may serve to discharge out-gas that may be generated in the circuit element layer CCL (refer to FIGS. 7 and 8) in a display device manufacturing process.

As described above, because the first alignment electrode RME1 is integrally formed across a plurality of adjacent sub-pixels SPXn, the sub-pixels SPXn can be more densely arranged in the display area DA, and accordingly, the resolution of the screen may be further improved. For example, because the width of the outer bank BNL disposed between the emission areas EMA of each sub-pixel SPXn may be reduced, the sub-pixels SPXn may be more densely disposed. In some embodiments, the width of the outer bank BNL in the first direction DR1 which is disposed between the plurality of emission areas EMA of each sub-pixels SPXn may be approximately 18 μm or less, but is not limited thereto.

As illustrated in FIG. 6, a plurality of inner banks BP may be disposed under each of the alignment electrodes RME. The plurality of inner banks BP may be disposed in the emission area EMA of the sub-pixel SPXn. The plurality of inner banks BP may include a first inner bank BP1 having a U-shape in plan view and a second inner bank BP2 having a bar shape in plan view. The first inner bank BP1 and the second inner bank BP2 may be disposed to be spaced apart from each other.

The first inner bank BP1 may be disposed below the first alignment electrode RME1 in the emission area EMA, and the second inner bank BP2 may be disposed below the second alignment electrode RME2 in the emission area EMA.

The first inner bank BP1 may include a first portion BP1$a$ disposed below the first electrode portion RME1$a$ of the first alignment electrode RME1 to extend in the second direction DR2, a second portion BP1$b$ disposed below the second electrode portion RME1$b$ of the first alignment electrode RME1 to extend in the second direction DR2, and a third portion BP1$c$ disposed below the third electrode portion RME1$c$ of the first alignment electrode RME1 to extend in the first direction DR1. The third portion BP1$c$ of the first inner bank BP1 may connect the first portion BP1$a$ and the second portion BP1$b$.

In one or more embodiments, the alignment electrodes RME may completely cover each of the inner banks BP disposed below each of the alignment electrodes RME in the emission area EMA, but the present disclosure is not limited thereto. For example, the alignment electrodes RME may partially cover each of the inner banks BP disposed under each of the alignment electrodes RME in the emission area EMA. FIG. 6 illustrates that each of the inner banks BP disposed under the each of the alignment electrodes RME in the emission area EMA are completely covered by the alignment electrodes RME.

In one or more embodiments, the first alignment electrode RME1 and the second alignment electrode RME2 may be spaced from each other to provide a space in which light emitting element ED is provided.

For example, the first electrode portion RME1$a$ may face the first side surface RME2$a$ of the second alignment electrode RME2 and may be spaced in the first direction DR1 to form a first separation space. The light emitting element ED may be disposed on the first separation space. The first separation space may form portions of a first path EA1 in which a first light emitting element ED1 is disposed and a second path EA2 in which a second light emitting element ED2 is disposed which will be described later. The first separation space and the outer bank BNL may be spaced from each other by a first width w1. For example, a separation distance in the first direction DR1 between the one side of the first electrode portion RME1$a$ of the first alignment electrode RME1 in the first direction DR1 and the first surface BNLa of the outer bank BNL may be the first width w1.

The second electrode portion RME1b may face the second side surface RME2b of the second alignment electrode RME2 and may be spaced in the first direction DR1 to form a second separation space. The light emitting element ED may be disposed in the second separation space. The second separation space may form portions of a third path EA3 in which a third light emitting element ED3 is disposed and the second path EA2 in which the second light emitting element ED2 is disposed as will be described later. The second separation space and the outer bank BNL may be spaced from each other by the first width w1. For example, a separation distance in the first direction DR1 between the other side of the second electrode portion RME1b of the first alignment electrode RME1 in the first direction DR1 and the second surface BNLb of the outer bank BNL may be the first width w1.

The third electrode portion RME1c may face the third side surface RME2c of the second alignment electrode RME2 and may be spaced in the second direction DR2 to form a third separation space. The light emitting element ED may be disposed in the third separation space. The third separation space may form a portion of a second path EA2 in which the second light emitting element ED2 is disposed as will be described later. The third separation space and the outer bank BNL may be spaced from each other by the first width w1. For example, a separation distance in the second direction DR2 between the other side of the third electrode portion RME1c of the first alignment electrode RME1 in the second direction DR2 and the third surface BNLc of the outer bank BNL may be the first width w1.

As described above, the first separation space, the second separation space, and the third separation space may be disposed to be spaced by the same gap, that is the first width w1, from the outer bank BNL in the emission area EMA. As will be described later, as the ink (INK, see FIGS. 9 and 10) in which the light emitting elements ED are dispersed is discharged onto the emission area EMA by an ink-jet method, the volume of the ink INK may be changed according to the distance away from the outer bank BNL, and because the number of light emitting elements ED dispersed in the ink INK may be changed according to the volume of the ink INK, that is, the distance away from the outer bank BNL, this may be to uniformly align the light emitting elements ED by locating the paths EA1, EA2, and EA3 in which the light emitting elements ED are disposed at the same distance from the outer bank BNL. A detailed description thereof will be provided later.

In addition, because the area occupied by the sub-pixels SPXn decreases as the resolution of the screen increases, the area of the emission area EMA in which the ink INK in which the light emitting elements ED are dispersed is discharged in a display device manufacturing process to be described later can be reduced. As will be described later, because the number of the light emitting elements ED dispersed in the ink INK discharged to the emission area EMA decreases as they become more adjacent to the outer bank BNL, it is necessary to secure a linear distance between the outer bank BNL and the paths EA1, EA2, and EA3 in which the light emitting elements ED are aligned. In one or more embodiments, the first width w1 may be 5 μm or more, but is not limited thereto. When the first width w1 is 5 μm or more, the number of aligned light emitting elements ED may be secured. A detailed description thereof will be provided later.

Referring to FIG. 5, the light emitting element ED may be a light emitting diode. Specifically, the light emitting element ED may be an inorganic light emitting diode that has a nanometer or micrometer size, and is made of an inorganic material. The light emitting element ED may be aligned between two electrodes having polarity when an electric field is formed in a specific direction between two electrodes facing each other.

The light emitting element ED according to one or more embodiments may have a shape elongated in one direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped and a hexagonal prism, or may have various shapes such as a shape elongated in one direction and having an outer surface partially inclined.

The light emitting element ED may include a semiconductor layer doped with any conductivity type (e.g., p-type or n-type) dopants. The semiconductor layer may emit light of a specific wavelength band by receiving an electrical signal applied from an external power source. The light emitting element ED may include a first semiconductor layer 31, a second semiconductor layer 32, an emissive layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N(0\leq x\leq 1, 0\leq y\leq 1, 0\leq x+y\leq 1)$. For example, the first semiconductor layer 31 may be one or more selected from among n-type doped AlGaInN, GaN, AlGaN, InGaN, AlN, and InN. The n-type dopant doped into the first semiconductor layer 31 may be Si, Ge, Sn, Se or the like.

The second semiconductor layer 32 is disposed on the first semiconductor layer 31 with the emissive layer 36 therebetween. The second semiconductor layer 32 may be a p-type semiconductor, and the second semiconductor layer 32 may include a semiconductor material having a chemical formula of $Al_xGa_yIn_{1-x-y}N$ $(0\leq x\leq 1, 0\leq y\leq 1, 0\leq x+y\leq 1)$. For example, the second semiconductor layer 32 may be one or more selected from among p-type doped AlGaInN, GaN, AlGaN, InGaN, AlN and InN. The p-type dopant doped into the second semiconductor layer 32 may be Mg, Zn, Ca, Ba, or the like.

Accordingly, the both ends of the light emitting element ED may have different polarities. In the following description, one end of the both ends of the light emitting element ED that is adjacent to the second semiconductor layer 32 will be described referred to as a "first end", while the other end adjacent to the first semiconductor layer 31 will be described referred to as a "second end" for convenience of illustration. The first end of the light emitting element ED may be located opposite to the second end.

The first end and the second end of the light-emitting element ED may have different polarities. In addition, the first ends of different light-emitting elements ED may have the same polarity, and the second ends of different light-emitting elements ED may have the same polarity.

Although each of the first semiconductor layer 31 and the second semiconductor layer 32 is implemented as a single layer in the drawings, the present disclosure is not limited thereto. Depending on the material of the emissive layer 36, the first semiconductor layer 31 and the second semiconductor layer 32 may further include a larger number of layers, e.g., a clad layer or a tensile strain barrier reducing (TSBR) layer. For example, the light emitting elements ED may further include another semiconductor layer disposed between the first semiconductor layer 31 and the emissive layer 36 or between the second semiconductor layer 32 and the emissive layer 36. The semiconductor layer disposed between the first semiconductor layer 31 and the emissive layer 36 may be one or more selected from among AlGaInN, GaN, AlGaN, InGaN, AlN, InN and SLs doped with an n-type dopant. The semiconductor layer disposed between the second semiconductor layer 32 and the emissive layer 36 may be one or more selected from among AlGaInN, GaN, AlGaN, InGaN, AlN, and InN doped with a p-type dopant.

The emissive layer 36 is disposed between the first semiconductor layer 31 and the second semiconductor layer 32. The emissive layer 36 may include a material having a single or multiple quantum well structure. When the emissive layer 36 includes a material having the multiple quantum well structure, the structure may include quantum layers and well layers alternately stacked on one another. The emissive layer 36 may emit light as electron-hole pairs are combined therein in response to an electrical signal applied through the first semiconductor layer 31 and the second semiconductor layer 32. The emissive layer 36 may include a material such as AlGaN, AlGaInN, and InGaN. In particular, when the emissive layer 36 has a multi-quantum well structure in which quantum layers and well layers are alternately stacked on one another, the quantum layers may include AlGaN or AlGaInN, and the well layers may include a material such as GaN and AlGaN.

The emissive layer 36 may have a structure in which a semiconductor material having a large band gap energy and a semiconductor material having a small band gap energy are alternately stacked on one another, and may include other Group III to Group V semiconductor materials depending on the wavelength range of the emitted light. Accordingly, the light emitted from the emissive layer 36 is not limited to the light of the blue wavelength band.

The electrode layer 37 may be an ohmic connection electrode and may be disposed on the first end and/or the second end of the light emitting element ED on the second semiconductor layer 32 and/or the first semiconductor layer 31, respectively. It is, however, to be understood that the present disclosure is not limited thereto. The electrode layer 37 may be a Schottky connection electrode. The light emitting element ED may include at least one electrode layer 37. The light-emitting element ED may include one or more electrode layers 37. It is, however, to be understood that the present disclosure is not limited thereto. The electrode layer 37 may be eliminated.

The electrode layer 37 can reduce the resistance between the light emitting element ED and the electrodes or the connection electrodes when the light emitting element ED is electrically connected to the electrodes or the connection electrodes in the display device 1. The electrode layer 37 may include a metal having conductivity. For example, the electrode layer 37 may include at least one selected from among aluminum (Al), titanium (T1), indium (In), gold (Au), silver (Ag), ITO, IZO and ITZO. With the above-described configuration, the both ends of each of the light emitting elements ED may have different polarities.

The insulating film 38 is disposed to be around (e.g., to surround) the outer surfaces (e.g., the outer peripheral or circumferential surfaces) of the plurality of semiconductor layers and electrode layers described above. For example, the insulating film 38 may be disposed to be around (e.g., to surround) at least the outer surface (e.g., the outer peripheral or circumferential surface) of the emissive layer 36, with both ends of the light emitting element ED in the longitudinal direction exposed. In addition, a part of the upper surface of the insulating film 38 may be rounded in cross section, which is adjacent to at least one of the ends of the light emitting element ED.

The insulating film 38 may include materials having insulating properties, for example, at least one selected from among silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and titanium oxide (TiOx). Although the insulating film 38 is formed as a single layer in the drawings, the present disclosure is not limited thereto. In one or more embodiments, the insulating film 38 may be made up of a multilayer structure in which multiple layers are stacked on one another.

The insulating film 38 can protect the semiconductor layers and the electrode layer of the light emitting elements ED. The insulating film 30 can prevent an electrical short-circuit that may occur in the emissive layer 36 if it comes in direct contact with an electrode through which an electric signal is transmitted to the light emitting element ED. In addition, the insulating film 38 can prevent a decrease in luminous efficiency of the light emitting element ED.

In addition, the outer surface (e.g., the outer peripheral or circumferential surface) of the insulating film 38 may be subjected to surface treatment. The light emitting elements ED may be dispersed in an ink, and the ink may be sprayed onto the electrode. In doing so, a surface treatment may be applied to the insulating film 38 so that it becomes hydrophobic or hydrophilic in order to keep the light emitting elements ED dispersed in the ink from being aggregated with one another.

Referring back to FIGS. 4 and 6, the light emitting elements ED may include the first light emitting element ED1 disposed on the first path EA1, the second light emitting element ED2 disposed on the second path EA2, and the third light emitting element ED3 disposed on the third path EA3 in the emission area EMA of each of the sub-pixels SPXn.

Each of the plurality of light emitting elements ED, that is the first light emitting element ED1, the second light emitting element ED2, and the third light emitting element ED3, has a black line. The black line of each of the plurality of light emitting elements ED may be the emissive layer 36 shown in FIG. 5. The end of each of the first light emitting element ED1, the second light emitting element ED2, and the third light emitting element ED3 that is closer to the black line may be the above-described first end, whereas the opposite end thereof may be the second end.

As a part of the first separation space disposed between the first electrode portion RME1a of the first alignment electrode RME1 and the first side surface RME2a of the second alignment electrode RME2, the first path EA1 may substantially have a shape extending in the second direction DR2.

As a part of the second separation space disposed between the second electrode portion RME1b of the first alignment electrode RME1 and the second side surface RME2b of the second alignment electrode RME2, the third path EA3 may substantially have a shape extending in the second direction DR2.

The second path EA2 may have a substantially U-shape. For example, the second path EA2 may include a first portion having a shape substantially extending in the second direction DR2 as a part of the first separation space, a second portion having a shape substantially extending in the second direction DR2 as a part of the second separation space, and a third portion having a shape substantially extending in the first direction DR1 as a part of the third separation space. The third portion may connect the first portion and the second portion.

The first path EA1 may be spaced from the first portion of the second path EA2 in the second direction DR2, and the third path EA3 may be spaced from the second portion of the second path EA2 in the second direction DR2.

The light emitting elements ED may be arranged along the shapes of the paths EA1, EA2, and EA3. For example, the first light emitting elements ED1 may be arranged along the shape of the first path EA1 along the second direction DR2, the second light emitting elements ED2 may be arranged along the U-shape of the second path EA2 along the second direction DR2 at the first portion and the second portion and along the first direction DR1 at the third portion, and the third light emitting elements ED3 may be arranged along the third path EA3 along the second direction DR2.

In one or more embodiments, first ends of the light emitting elements ED may be disposed on the second alignment electrode RME2 and second ends of the light emitting elements ED may be disposed on the first alignment electrode RME1, but the present disclosure is not limited thereto. For example, the first ends of the light emitting elements ED may be disposed on the first alignment electrode RME1, and the second ends of the light emitting elements ED may be disposed on the second alignment electrode RME2. FIGS. 4 and 6 illustrate that the first ends of the light emitting elements ED are disposed on the second alignment electrode RME2 and the second ends of the light emitting elements ED are disposed on the first alignment electrode RME1.

In one or more embodiments, the first path EA1, the second path EA2, and the third path EA3 may be classified according to the arrangement of a connection electrode CNE disposed on the light emitting element ED.

The connection electrode CNE may be disposed on the light emitting elements ED. The connection electrode CNE may include a first connection electrode CNE1, a second connection electrode CNE2, a third connection electrode CNE3, and a fourth connection electrode CNE4 that are spaced from each other.

The connection electrode CNE may include a first connection electrode layer CNEL1 including the first connection electrode CNE1 and the third connection electrode CNE3, and a second connection electrode layer CNEL2 including the second connection electrode CNE2 and the fourth connection electrode CNE4. The first connection electrode layer CNEL1 and the second connection electrode layer CNEL2 may be distinguished according to a stacking order. For example, in the display device manufacturing process, the first connection electrode layer CNEL1 may be formed before the second connection electrode layer CNEL2 in the display device manufacturing process.

The first connection electrode CNE1 may substantially extend in the second direction DR2. The first connection electrode CNE1 may be disposed on the first side surface RME2a of the second alignment electrode RME2. The first connection electrode CNE1 may be in contact with the first ends of the first light emitting elements ED1 arranged in the first path EA1.

The first connection electrode CNE1 may be electrically connected to the second alignment electrode RME2 through a first contact portion CT1. Because the first power voltage is applied to the second alignment electrode RME2 as described above, the first power voltage may be applied to the first connection electrode CNE1. Accordingly, the first power voltage may be applied to the first ends of the first light emitting elements ED1 arranged in the first path EA1.

In one or more embodiments, the first contact portion CT1 may be disposed in the sub-region SA, but is not limited thereto.

The second connection electrode CNE2 may have a shape that is bent at least once in the emission area EMA. The second connection electrode CNE2 may include a first portion CNE2a in contact with the second end of the first light emitting element ED1 arranged on the first path EA1, a second portion CNE2b in contact with the first end of the second light emitting element ED2 arranged on the second path EA2, and a connection portion CNE2c connecting the first portion CNE2a and the second portion CNE2b.

The first portion CNE2a of the second connection electrode CNE2 may be disposed on the first electrode portion RME1a of the first alignment electrode RME1 to have a shape that substantially extends in the second direction DR2. The first portion CNE2a may have a wiring width of a second width w2 and extend in the second direction DR2.

The second portion CNE2b of the connection electrode CNE2 may be disposed on one side of the second alignment electrode RME2 in the second direction DR2 to entirely cover the third side surface RME2c of the second alignment electrode RME2 and partially cover the first side surface RME2a and the second side surface RME2b of the second alignment electrode RME2. For example, the second portion CNE2b may partially cover the first side surface RME2a of the second alignment electrode RME2 that overlaps the first portion of the second path EA2 in the first direction and may partially cover the second side surface RME2b of the second alignment electrode RME2 that overlaps the second portion of the second path EA2 in the first direction DR1. In other words, the wiring width of the second portion may have a third width w3 greater than a wiring width w4 of the second alignment electrode RME2. In one or more embodiments, the third width w3 may be greater than the second width w2, but is not limited thereto.

By having the above-described shape, the second portion CNE2b may be in contact with the first ends of the second light emitting elements ED2 arranged in U-shape in the second path EA2 bent in U-shape.

The connection portion CNE2c of the second connection electrode CNE2 may delimit the first path EA1 and the second path EA2. For example, the connection portion CNE2c may cross the separation space in the second direction DR2 between the first path EA1 and the second path EA2. Accordingly, the first separation space between the first electrode portion RME1a of the first alignment electrode RME1 and the first side surface RME2a of the second alignment electrode RME2 may be distinguished as the first portion of the first path EA1 and the second path EA2.

The third connection electrode CNE3 may have a shape that is bent at least once in the emission area EMA. The third connection electrode CNE3 may include a first portion CNE3a in contact with the second end of the second light emitting element ED2 arranged in the second path EA2, a second portion CNE3b in contact with the first end of the third light emitting element ED3 arranged on the third path EA3, and a connection portion CNE3c connecting the first portion CNE3a and the second portion CNE3b.

The first portion CNE3a of the third connection electrode CNE3 may be disposed at least on a part of the first electrode portion RME1a of the first alignment electrode RME1, a part of the second electrode portion RME1b and the third electrode portion RME1c of the first alignment electrode RME1 to have a shape substantially bent in a U-shape.

For example, the first portion CNE3a may include a first extension portion CNE3aa extending in the second direction DR2 to face the first side surface RME2a of the second alignment electrode RME2, a second extension portion CNE3ab extending in the second direction DR2 to face the second side surface RME2b of the second alignment electrode RME2, and a third extension portion CNE3ac extending in the first direction DR1 to connect the first extension portion CNE3aa and the second extension portion CNE3ab and face the third side surface RME2c of the second alignment electrode RME2.

The first extension portion CNE3aa may be in contact with the second end of the second light emitting element ED2 arranged on the first portion of the second path EA2, the second extension portion CNE3ab may be in contact with the second end of the second light emitting element ED2 arranged on the second portion of the second path EA2, and the third extension portion CNE3ac may be in contact with the second end of the second light emitting element ED2 arranged on the third portion of the second path EA2.

The second portion CNE3b of the third connection electrode CNE3 may be disposed on the second side surface RME2b of the second alignment electrode RME2 and have a shape substantially extending in the second direction DR2. The second portion CNE3b may be spaced from the first connection electrode CNE1 on the second alignment electrode RME2.

The connection portion CNE3c of the third connection electrode CNE3 may be divided into the third path EA3 and a second path EA2. For example, the connection portion CNE3c may cross the separation space in the second direction DR2 between the third path EA3 and the second path EA2. Accordingly, the second separation space between the second electrode portion RME1b of the first alignment electrode RME1 and the second side surface RME2b of the second alignment electrode RME2 may be divided as the third path EA3 and the second portion of the second path EA2.

The fourth connection electrode CNE4 may substantially extend in the second direction DR2. The fourth connection electrode CNE4 may be disposed on the second electrode portion RME1b of the first alignment electrode RME1. The fourth connection electrode CNE4 may be in contact with the second end of the third light emitting elements ED3 arranged in the third path EA3.

The fourth connection electrode CNE4 may be electrically connected to the first alignment electrode RME1 through a second contact portion CT2. As described above, because the second power voltage is applied to the first alignment electrode RME1, the second power voltage may also be applied to the fourth connection electrode CNE4. Accordingly, the second power voltage may be applied to the second ends of the third light emitting elements ED3 arranged in the third path EA3.

With the above-described configuration, the first light emitting element ED1, the second light emitting element ED2, and the third light emitting element ED3 may be connected in series. For example, a first power voltage may be applied to the first end of the first light emitting element ED1, a second end may be electrically connected to the first end of the second light emitting element ED2, the second end of the second light emitting element ED2 may be electrically connected to the first end of the third light emitting element ED3 and a second power voltage may be applied to the second end of the third light emitting element ED3. Accordingly, higher luminance may be expressed with the same current than in the case where the first power voltage is applied to the first end of one light emitting element ED and the second power voltage is applied to the second end of the light emitting element ED.

Hereinafter, a device stack structure of one sub-pixel SPXn will be described.

Figure 7:
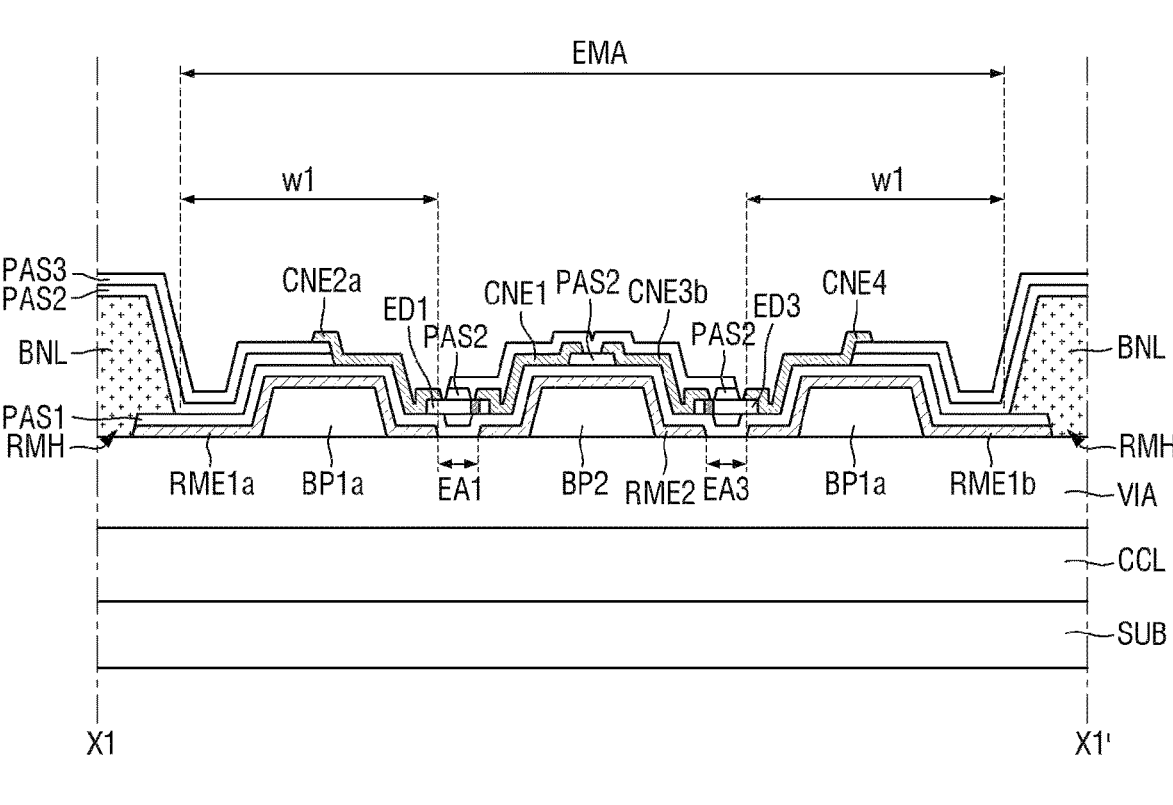
FIG. 7 is a cross-sectional view schematically illustrating a cross section taken along the line X1-X1' of FIG. 6.
Figure 7:
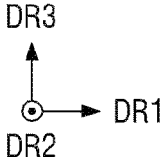
Figure 8:
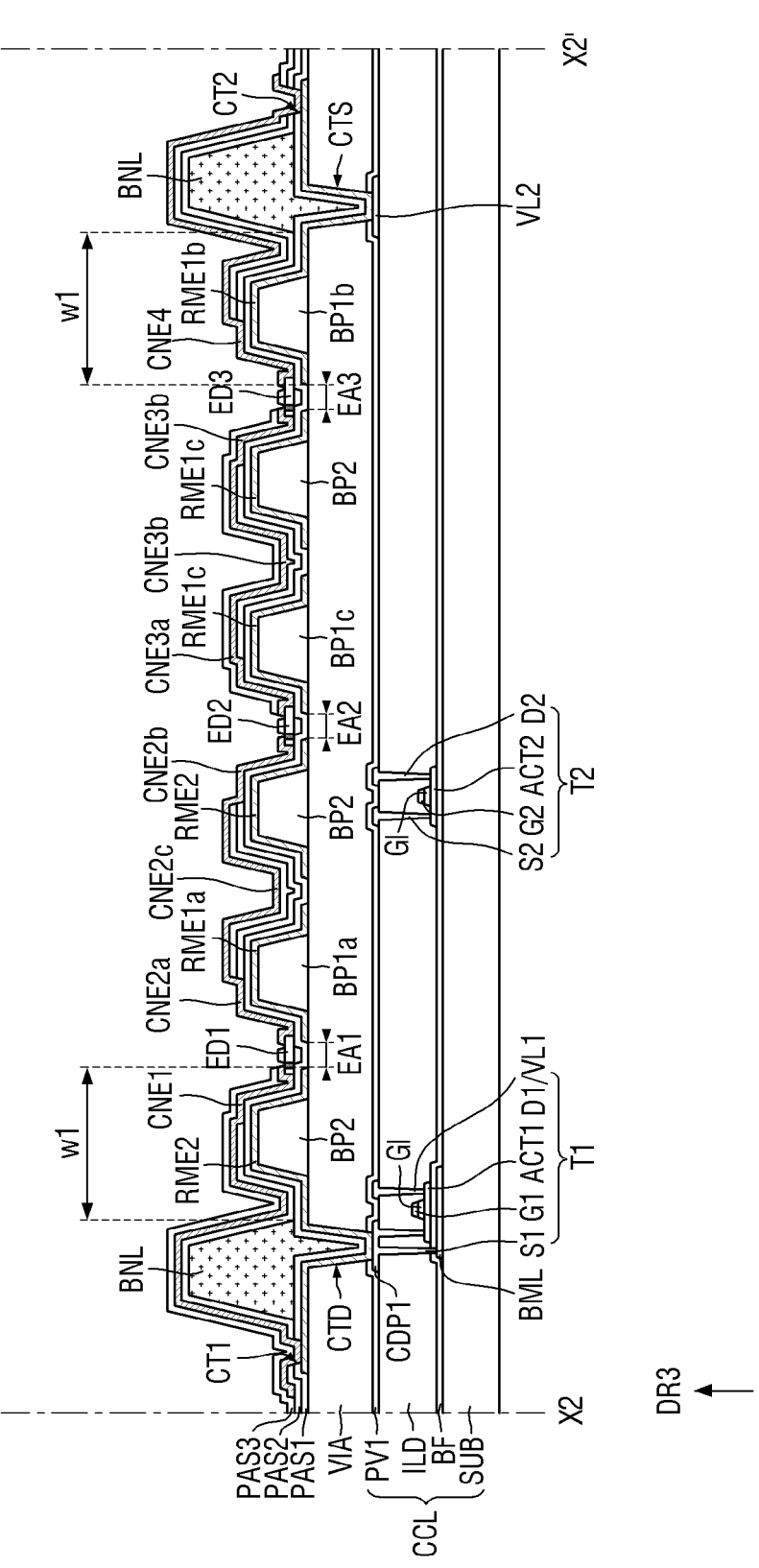
FIG. 8 is a cross-sectional view schematically illustrating a cross section taken along the line X2-X2' of FIG. 6.

FIG. 7 is a cross-sectional view schematically illustrating a cross section taken along the line X1-X1' of FIG. 6. FIG. 8 is a cross-sectional view schematically illustrating a cross section taken along the line X2-X2' of FIG. 6.

FIG. 7 illustrates a cross-section crossing a through hole RMH, a first light emitting element ED1 and a third light emitting element ED3, and FIG. 8 illustrates a cross-section crossing the first contact portion CT1, the first electrode contact hole CTD, the first light emitting element ED1, the second light emitting element ED2, the third light emitting element ED3, the second electrode contact hole CTS, and the second contact portion CT2.

The cross-sectional structure of the one sub-pixel SPXn a display device according to one or more embodiments is described with reference to FIGS. 7 and 8 in conjunction with FIG. 6. The display device 1 may include a substrate SUB and a semiconductor layer disposed thereon, a plurality of conductive layers, and a plurality of insulating layers. Also, as described above, the display device 1 may include the plurality of electrodes RME, the light emitting element ED, and the connection electrode CNE. The semiconductor layer, the conductive layers, and the insulating layers may each constitute the circuit element layer CCL of the display device 1.

The substrate SUB may be made of an insulating material such as glass, quartz, or polymer resin. Further, the substrate SUB may be a rigid substrate, but may also be a flexible substrate that can be bent, folded and/or rolled.

The circuit element layer CCL may be disposed on the substrate SUB. In the circuit element layer, various wirings that transmit electrical signals to the light emitting element ED disposed on the substrate SUB may be disposed. As illustrated in FIGS. 7 and 8, the circuit element layer CCL may include a first conductive layer, a semiconductor layer, a second conductive layer, and a third conductive layer as a plurality of conductive layers and may include a buffer layer BF, a first gate insulating layer GI, a first interlayer insulating layer ILD, and a first passivation layer PV1 and the like as a plurality of insulating layers.

The first conductive layer may be disposed on the substrate SUB. The first conductive layer includes a lower metal layer BML, and the lower metal layer BML is disposed to overlap an active layer ACT1 of a first transistor T1 in the third direction DR3. The lower metal layer BML may prevent light from being incident on the first active layer ACT1 of the first transistor T1 or may be electrically connected to the first active layer ACT1 to perform a function of stabilizing electrical characteristics of the first transistor T1. However, the lower metal layer BML may be omitted.

The buffer layer BF may be disposed on the lower metal layer BML and the substrate SUB. The buffer layer BF may be formed on the substrate SUB to protect the transistors of the pixel PX from moisture permeating through the substrate SUB susceptible to moisture permeation, and may perform a surface planarization function.

The semiconductor layer is disposed on the buffer layer BF. The semiconductor layer may include the first active layer ACT1 of the first transistor T1 and a second active layer ACT2 of a second transistor T2. The first active layer ACT1 and the second active layer ACT2 may be disposed to partially overlap a first gate electrode G1 and a second gate electrode G2 of a second conductive layer to be described later, respectively, in the third direction DR3.

The semiconductor layer may include polycrystalline silicon, monocrystalline silicon, oxide semiconductor, and the like. In one or more embodiments, the semiconductor layer may include polycrystalline silicon. The oxide semiconductor may be an oxide semiconductor containing indium (In). For example, the oxide semiconductor may be at least one selected from among indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

Although it is illustrated in the drawing that the first transistor T1 and the second transistor T2 are disposed in the pixel PX of the display device 1, the present disclosure is not limited thereto and the display device 1 may include a larger number of transistors.

A first gate insulating layer GI is disposed on the semiconductor layer in the display area DA. The first gate insulating layer GI may serve as a gate insulating layer of each of the transistors T1 and T2. Although it is illustrated in the drawing that the first gate insulating layer GI is patterned together with the gate electrodes G1 and G2 of the second conductive layer to be described later and partially disposed between the second conductive layer and the active layers ACT1 and ACT2 of the semiconductor layer, the present disclosure is not limited thereto. In some embodiments, the first gate insulating layer GI may be entirely disposed on the buffer layer BF.

The second conductive layer is disposed on the first gate insulating layer GI. The second conductive layer may include a first gate electrode G1 of the first transistor T1 and a second gate electrode G2 of the second transistor T2. The first gate electrode G1 may be disposed to overlap the channel region of the first active layer ACT1 in the third direction DR3 that is a thickness direction of the substrate SUB, and the second gate electrode G2 may be disposed to overlap the channel region of the second active layer ACT2 in the third direction DR3 that is the thickness direction of the substrate SUB.

A first interlayer insulating layer ILD is disposed on the second conductive layer. The first interlayer insulating layer ILD may function as an insulating film between the second conductive layer and other layers disposed thereon, and may protect the second conductive layer.

A third conductive layer is disposed on the first interlayer insulating layer ILD. The third conductive layer may include the first voltage line VL1 and the second voltage line VL2, a first conductive pattern CDP1, a source electrode S1 and a drain electrode D1 of the transistor T1, and a source electrode S2 and a drain electrode D2 of the transistor T2 that are disposed in the display area DA.

The first voltage line VL1 may be applied with a high potential voltage (or a first power voltage) transmitted to the second alignment electrode RME2, and the second voltage line VL2 may be applied with a low potential voltage (or a second power voltage) transmitted to a first alignment electrode RME1. A part of the first voltage line VL1 may be in contact with the first active layer ACT1 of the first transistor T1 through a contact hole that passes through the first interlayer insulating layer ILD. The first voltage line VL1 may serve as a first drain electrode D1 of the first transistor T1. The first voltage line VL1 may be directly connected to the second alignment electrode RME2 and the second voltage line VL2 may be directly connected to first alignment electrode RME1.

A first conductive pattern CDP1 may be in contact with the first active layer ACT1 of the first transistor T1 through the contact hole penetrating the first interlayer insulating layer ILD. The first conductive pattern CDP1 may be in contact with the lower metal layer BML through another contact hole penetrating the first interlayer insulating layer ILD and the buffer layer BF. The first conductive pattern CDP1 may serve as a first source electrode S1 of the first transistor T1. Further, the first conductive pattern CDP1 may be connected to the second alignment electrode RME2 or the first connection electrode CNE1 to be described later. The first transistor T1 may transmit the first power voltage applied from the first voltage line VL1 to the second alignment electrode RME2 or the first connection electrode CNE1.

A second source electrode S2 and a second drain electrode D2 may be in contact with the second active layer ACT2 of the second transistor T2 through the contact holes penetrating the first interlayer insulating layer ILD.

A first passivation layer PV1 is disposed on the third conductive layer. The first passivation layer PV1 may function as an insulating layer between the third conductive layer and other layers and may protect the third conductive layer.

The buffer layer BF, the first gate insulating layer GI, the first interlayer insulating layer ILD, and the first passivation layer PV1 described above may be formed of a plurality of inorganic layers stacked in an alternating manner. For example, the buffer layer BF, the first gate insulating layer GI, the first interlayer insulating layer ILD, and the first passivation layer PV1 may be formed as a double layer formed by stacking, or a multilayer formed by alternately stacking, inorganic layers including at least one of silicon oxide (SiOx), silicon nitride (SiNx), or silicon oxynitride (SiOxNy).

A via insulating layer VIA may be disposed on the circuit element layer CCL. Specifically, the via insulating layer VIA may be disposed on the first passivation layer PV1 of the circuit element layer CCL. The via insulating layer VIA may include an organic insulating material, for example, an organic insulating material such as polyimide, and may form a flat top surface while compensating for a step difference due to various wirings inside the circuit element layer.

An inner bank BP is disposed on the top surface of the via insulating layer VIA. In other words, the via insulating layer VIA and the inner bank BP may be in direct contact.

The inner banks BP may be disposed on the via insulating layer VIA. The inner bank BP may have a side surface that is inclined or curved with a certain curvature, and the light emitted from the light emitting element ED may be reflected from the alignment electrode RME disposed on the inner bank BP and may be emitted to one side in the third direction DR3. The inner banks BP may include, but are not limited to, an organic insulating material made of a transparent material such as polyimide. For example, the inner banks BP may further include a colored dye such as a black pigment.

The plurality of alignment electrodes RME may be disposed on the inner bank BP and the via insulating layer VIA.

As illustrated in FIG. 8, the first electrode portion RME1a of the first alignment electrode RME1 may be disposed on the first portion BP1a of the first inner bank BP1 and extend in a direction toward the second inner bank BP2, the second electrode portion RME1b of the first alignment electrode RME1 may be disposed on the second portion BP1b of the first inner bank BP1 and extend in a direction toward the second inner bank BP2, the third electrode portion RME1c of the first alignment electrode RME1 may be disposed on the third portion BP1c of the first inner bank BP1 and extend in a direction toward the second inner bank BP2, and the second alignment electrode RME2 may be disposed on the second inner bank BP2 and may extend in a direction toward the first inner bank BP1.

The gap in which the first alignment electrode RME1 and the second alignment electrode RME2 are spaced from each other may be narrower than the gap between the first inner bank BP1 and the second inner bank BP2. For example, at least a partial region of the first alignment electrode RME1 and the second alignment electrode RME2 may be directly disposed on the via insulating layer VIA, and may be disposed on the same plane.

The second electrode RME2 may be in contact with the first conductive pattern CDP1 through the first electrode contact hole CTD penetrating the via insulating layer VIA and the first passivation layer PV1. The second electrode portion RME1b of the first alignment electrode RME1 may be in contact with the second voltage line VL2 through the second electrode contact hole CTS penetrating the via insulating layer VIA and the first passivation layer PV1.

The alignment electrode RME may reflect light emitted from the light emitting element ED. Specifically, the light emitting elements ED may be disposed between the inner banks BP to emit light in both end directions, and the emitted light may be directed to the alignment electrode RME disposed on the inner banks BP. Accordingly, the light emitted from the light emitting element ED may be reflected by the alignment electrode RME and emitted in the third direction DR3.

The alignment electrodes RME may include a conductive material having a high reflectance. For example, the alignment electrodes RME may include a metal such as silver (Ag), copper (Cu) and aluminum (Al), or may include an alloy including aluminum (Al), nickel (Ni), lanthanum (La), or the like, or a stack of a metal layer such as titanium (Ti), molybdenum (Mo) and niobium (Nb) and the alloy. In one or more embodiments, the alignment electrodes RME may be made up of a double- or multi-layer in which an alloy containing aluminum (Al) and at least one metal layer made of titanium (Ti), molybdenum (Mo) and niobium (Nb) are stacked on one another.

It is, however, to be understood that the present disclosure is not limited thereto. The alignment electrodes RME may further include a transparent conductive material. For example, each of the alignment electrodes RME may include a material such as ITO, IZO, and TZO. In one or more embodiments, each of the alignment electrodes RME1 and RME2 may have a structure in which one or more layers of a transparent conductive material and one or more metal layers having high reflectivity are stacked on one another, or may be made up of a single layer including them. For example, each of the alignment electrodes RME may have a stack structure such as ITO/Ag/ITO/, ITO/Ag/IZO, or ITO/Ag/ITZO/IZO. The alignment electrodes RME may be electrically connected to the light emitting elements ED and may reflect some of the lights emitted from the light emitting elements ED toward the upper side of the substrate SUB.

As illustrated in FIG. 7, the alignment electrode RME may include a through hole RMH passing through the alignment electrode RME. As described above, the through hole RMH may serve to discharge out-gas that may be generated from the circuit element layer CCL disposed thereunder.

The first insulating layer PAS1 may be disposed on the front surface of the display area DA, and may be disposed on the plurality of alignment electrodes RME. The first insulating layer PAS1 may include an insulating material, and can protect the plurality of alignment electrodes RME and can insulate different alignment electrodes RME from one another. As the first insulating layer PAS1 is disposed to cover the alignment electrodes RME before the outer bank BNL is formed, it is possible to prevent the alignment electrodes RME from being damaged during the process of forming the outer bank BNL. In addition, the first insulating layer PAS1 can also prevent that the light emitting elements ED disposed thereon are brought into contact with other elements and damaged.

In one or more embodiments, the first insulating layer PAS1 may have steps so that a part of the upper surface is recessed between the alignment electrodes RME that are spaced from each other in the first direction DR1. The light emitting elements ED may be disposed at the steps of the upper surface of the first insulating layer PAS1, and space may be formed between the light emitting elements ED and the first insulating layer PAS1.

The first insulating layer PAS1 may include contact portions CT1 and CT2. The contact portions may be located such that they overlap with different alignment electrodes RME, respectively. For example, the contact portions may include a first contact portion CT1 overlapping the second alignment electrode RME2 and a second contact portion CT2 overlapping the second electrode portion RME1b of the first alignment electrode RME1. The first contact portion CT1 and the second contact portion CT2 may penetrate the first insulating layer PAS1 to expose a part of the upper surface of the second electrode portion RME1b of the first alignment electrode RME1 or the second alignment electrode RME2 disposed thereunder.

Each of the first contact portion CT1 and the second contact portion CT2 may further penetrate some of the other insulating layers disposed on the first insulating layer PAS1. The alignment electrodes RME exposed by the contact portions may be in contact with the connection electrodes CNE. The light emitting elements ED are in contact with the connection electrodes CNE and are electrically connected to the circuit element layer CCL under the alignment electrodes RME and the via insulating layer VIA, so that they can emit lights in certain wavelength bands by receiving an electrical signal.

Also, the first insulating layer PAS1 may further include a through hole passing through the first insulating layer PAS1 at a portion overlapping the through hole RMH passing through the alignment electrode RME. Accordingly, outgas that may be generated from the circuit element layer CCL may be discharged.

The outer bank BNL may be disposed on the first insulating layer PAS1. The outer bank BNL may include portions extended in the first direction DR1 and the second direction DR2 and may be around (e.g., may surround) each of the sub-pixels SPXn. The outer banks BNL may be around (e.g., may surround) the sub-pixels SPXn to separate them from one another, and may be around (e.g., may surround) the border of the display area DA to distinguish between the display area DA and the non-display area NDA.

The outer bank BNL may have a suitable height (e.g., a predetermined height) similar to that of the inner banks BP. In one or more embodiments, the upper surface of the outer bank BNL may be higher than that of the inner banks BP, and the thickness thereof may be equal to or greater than that of the inner banks BP. Accordingly, the outer bank BNL can effectively prevent an ink from overflowing into adjacent pixels PX during an inkjet printing process of the process of fabricating the display device 1. The outer bank BNL may include, but is not limited to, an organic insulating material made of a transparent material such as polyimide, like the inner banks BP. For example, the outer bank BNL may include a colored dye such as a black pigment.

The second insulating layer PAS2 may be disposed on the light emitting elements ED, the first insulating layer PAS1 and the outer bank BNL. The second insulating layer PAS2 may be extended in the first direction DR1 between the inner bank patterns BP and may include a pattern portion disposed on the plurality of light emitting elements ED. The pattern portion may be disposed to partially surround the outer surface (e.g., the outer peripheral or circumferential surface) of the light emitting elements ED, and may not cover both sides or both ends of the light emitting elements ED. The pattern portion may form a linear or island pattern in each sub-pixel SPXn. The pattern portion of the second insulating layer PAS2 can protect the light emitting elements ED and can fix the light emitting elements ED during the process of fabricating the display device 1. In addition, the second insulating layer PAS2 may be disposed to fill the space between light emitting elements ED and the first insulating layer PAS1 thereunder.

The second insulating layer PAS2 may include contact portions CT1 and CT2. The contact portions may be located such that they overlap with different alignment electrodes RME, respectively. For example, the contact portions may include a first contact portion CT1 overlapping with the second alignment electrode RME2 and a second contact portion CT2 overlapping with the second electrode portion RME1$b$ of the first alignment electrode RME1. The first contact portion CT1 and the second contact portion CT2 may penetrate the second insulating layer PAS2 to expose a part of the upper surface of the second electrode portion RME1$b$ of the first alignment electrode RME1 or the second alignment electrode RME2 disposed thereunder.

Each of the first contact portion CT1 and the second contact portion CT2 may further penetrate some of the other insulating layers disposed on the second insulating layer PAS2. The alignment electrodes RME exposed by the contact portions may be in contact with the connection electrodes CNE. The light emitting elements ED are in contact with the connection electrodes CNE and are electrically connected to the circuit element layer CCL under the alignment electrodes RME and the via insulating layer VIA, so that they can emit lights in certain wavelength bands by receiving an electrical signal.

The first connection electrode layer CNEL1 of the connection electrodes CNE may be disposed on the second insulating layer PAS2. The first connection electrode CNE1 and the third connection electrode CNE3 of the first connection electrode layer CNEL1 may be disposed on the second insulating layer PAS2 to contact the light emitting elements ED. Because the contact relationship between first and third connection electrodes CNE1 and CNE3 and the light emitting elements ED is as described above, a detailed description thereof will be omitted below.

The first connection electrode CNE1 may be disposed to be extended from the emission area EMA beyond the outer bank BNL as shown in FIG. 8. The first connection electrode CNE1 may be in contact with the second alignment electrode RME2 through the first contact portion CT1 penetrating through the first insulating layer PAS1 and the second insulating layer PAS2. Accordingly, the first connection electrode CNE1 may be electrically connected to the first transistor T1 so that the first power voltage may be applied thereto.

The third insulating layer PAS3 may be disposed on the second insulating layer PAS2, the first connection electrode layer CNEL1, and the outer bank BNL. The third insulating layer PAS3 may form a linear or island pattern in the emission area EMA of each sub-pixel SPXn. The linear or island pattern formed by the third insulating layer PAS3 may not cover the ends of the light emitting elements ED. In other words, the third insulating layer PAS3 may not cover the second ends of the light emitting elements ED that are not in contact with the first connection electrode layer CNEL1 in the emission area EMA.

The third insulating layer PAS3 may include the second contact portion CT2 overlapping the second electrode portion RME1$b$ of the first alignment electrode RME1. The second contact portion CT2 may penetrate the third insulating layer PAS3 to expose a part of the upper surface of the second electrode portion RME1$b$ of the first alignment electrode RME1 thereunder.

The second contact portion CT2 may further penetrate some of the other insulating layers disposed on the third insulating layer PAS3. The electrodes RME exposed by the contact portions CT1 and CT2 may be in contact with the connection electrodes CNE. The light emitting elements ED are in contact with the connection electrodes CNE and are electrically connected to the circuit element layer CCL under the alignment electrodes RME and the via insulating layer VIA, so that they can emit lights in certain wavelength bands by receiving an electrical signal.

A second connection electrode layer CNEL2 of the connection electrodes CNE may be disposed on the third insulating layer PAS3. The second connection electrode CNE2 and the fourth connection electrode CNE4 of the second connection electrode layer CNEL2 may be disposed on the third insulating layer PAS3 to contact the light emitting elements ED. Because the contact relationship between the second and fourth connection electrodes CNE2 and CNE4 and the light emitting elements ED is as described above, a detailed description thereof will be omitted below.

The fourth connection electrode CNE4 may partially overlap the second electrode portion RME1$b$ of the first alignment electrode RME1 and may be disposed to extend from the emission area EMA beyond the outer bank BNL as shown in FIG. 8. The fourth connection electrode CNE4 may be in contact with the second electrode portion RME1$b$ of the first alignment electrode RME1 through the second contact portion CT2 penetrating through the first insulating layer PAS1, the second insulating layer PAS2, and the third insulating layer PAS3. Accordingly, the fourth connection electrode CNE4 may be electrically connected to a second power line VL2 so that the second power voltage may be applied thereto.

The connection electrodes CNE may include a conductive material. For example, the connection electrodes CNE may include ITO, IZO, ITZO, aluminum (Al), etc. For example, the connection electrodes CNE may include a transparent conductive material, and lights emitted from the light-emitting elements ED may transmit the connection electrodes CNE to exit.

Each of the above-described first insulating layer PAS1, second insulating layer PAS2, and third insulating layer PAS3 may include an inorganic insulating material or an organic insulating material. According to one or more embodiments of the present disclosure, each of the first insulating layer PAS1, the second insulating layer PAS2, and the third insulating layer PAS3 may be made of at least one selected from among silicon oxide (SiOx), silicon nitride (SiNx), and silicon oxynitride (SiOxNy). The first insulating layer PAS1, the second insulating layer PAS2, and the third insulating layer PAS3 may be made of the same material.

Alternatively, some of them may be made of the same material while the other(s) may be made of different material (s), or they may be made of different materials.

Hereinafter, processes of fabricating a display device according to one or more embodiments of the present disclosure will be described.

Figure 9:
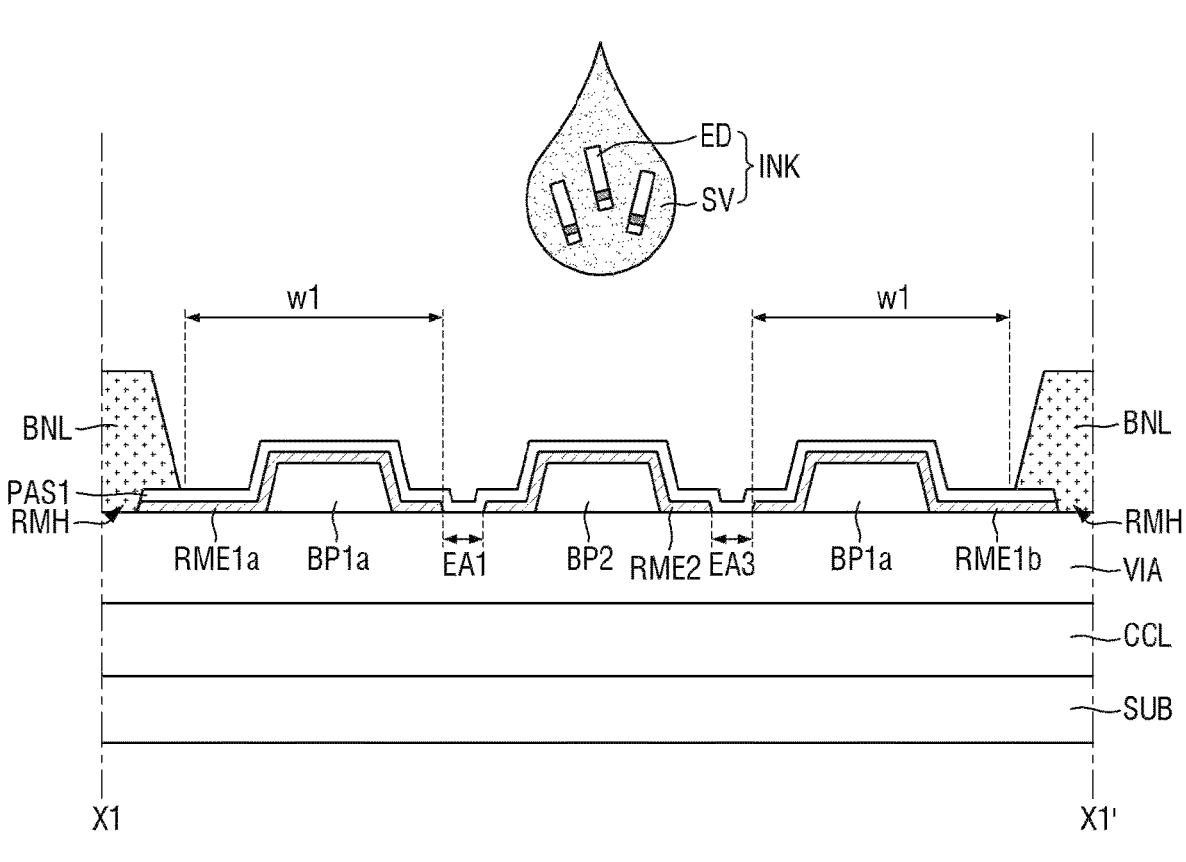
FIGS. 9 and 10 are cross-sectional views for illustrating a manufacturing process of a display device according to one or more embodiments.
Figure 9:
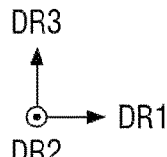
Figure 10:
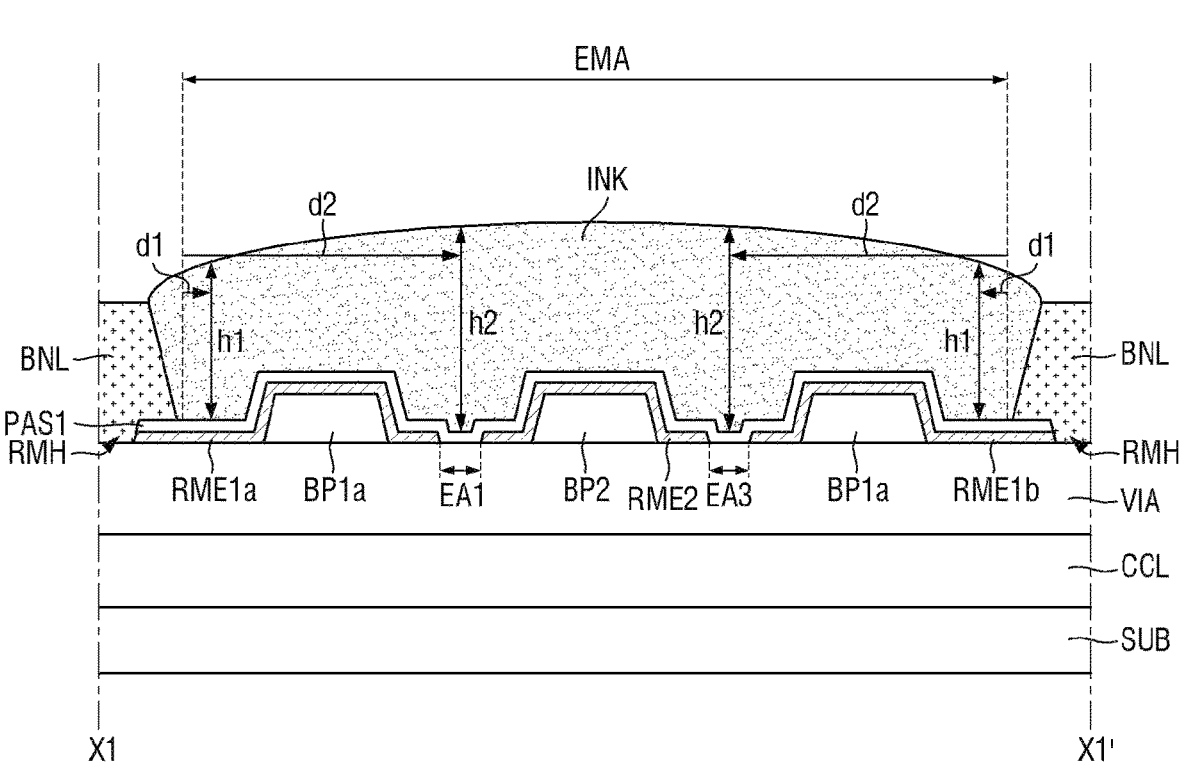
Figure 10:
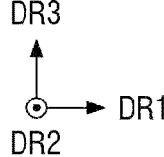

FIGS. 9 and 10 are cross-sectional views for illustrating a manufacturing process of a display device according to one or more embodiments. FIGS. 9 and 10 illustrate a process of discharging the light emitting element ED during the manufacturing process of the display device 1 according to one or more embodiments.

Because the process of forming the circuit element layer CCL, the via insulating layer VIA, the alignment electrode RME, the first insulating layer PAS1 and the outer bank BNL on the substrate SUB is well known in the art, a description thereof will be omitted.

Referring to FIGS. 9 and 10, the ink INK including a solvent SV and the light emitting element ED dispersed in the solvent SV is discharged on the alignment electrode RME. The discharge of the ink INK may be performed by an ink-jet printing apparatus.

When the inkjet printing apparatus discharges the ink INK, the ink INK is discharged to the area surrounded by the outer bank BNL, that is, the emission area EMA, and the discharged ink INK may form a meniscus convex to one side of the third direction DR3 with the outer bank BNL as an edge.

The meniscus formed by the discharged ink INK may have a shape in which a width in the third direction DR3, that is, a height, becomes narrower toward the outer bank BNL with respect to the reference line DL crossing the center of the emission area EMA. The meniscus formed by the ejected ink INK may be symmetrical about the reference line DL. In other words, the height formed by the ejected ink INK may vary depending on how far it is away from the outer bank BNL in the direction toward the reference line DL.

For example, the discharged ink INK may have a first height h1 at a portion adjacent to the outer bank BNL and a second height h2 greater than the height h1 at a portion adjacent to the reference line DL. A linear distance d1 of the discharged ink from the outer bank BNL to the portions having the first height h1 toward the reference line DL, the ejected ink INK may be equal to each other, and a linear distance d2 of the discharged ink INK from the outer bank BNL to the portions having the second height h2 toward the reference line DL may also be equal to each other. However, the linear distance d1 of the ink INK from the outer bank BNL to the portions having the first height h1 toward the reference line DL and the linear distance d2 of the ink INK from the outer bank BNL to the portions having the second height h2 toward the reference line DL may be different.

Because the height of the ejected ink INK is proportional to the volume of the ejected ink INK, the number of light emitting elements ED dispersed in the ink INK may be proportional to the height of the ejected ink INK. For example, the number of light emitting elements ED dispersed in a portion in which the ejected ink INK has a first height h1 may be smaller than the number of light emitting elements ED dispersed in a portion in which the ejected ink INK is dispersed in a portion having a second height h2.

The alignment of the light emitting elements ED dispersed in the ink INK may be performed using a dielectrophoresis (DEP) force caused by an electric field generated by the alignment signals having different potential values at the alignment electrode RME. Accordingly, the light emitting elements ED may be aligned on a space between the alignment electrodes RME. In the cases of FIGS. 9 and 10, light emitting elements ED will be aligned in the first path EA1 or the second path EA2.

However, if a linear distance between the outer bank BNL and the first path EA1 is different from linear distance between the outer bank BNL and the second path EA2, the ink INK disposed on the first path EA1 and the second path EA2 may have different heights and the numbers of the light emitting elements ED dispersed in the first path EA1 and the second EA2 may be different. Therefore, the numbers of light emitting elements ED aligned on the first path EA1 and the second path EA2 may be different. In this case, the probability of occurrence of dark spots increases in the paths in which a smaller number of light emitting elements ED are aligned from among the first path EA1 and the second path EA2, so that the luminance imbalance occurs, resulting in poor display quality of pixels.

Accordingly, by making the linear distance between the outer bank BNL and the first path EA1 the same as the linear distance between the outer bank BNL and the second path EA2 by the first width w1, the number of the light emitting elements ED aligned on the first path EA1 equalized with the number of the light emitting elements ED aligned on the second path EA2, thereby reducing the probability of occurrence of dark spots and preventing the luminance imbalance.

In addition, because the height of the ejected ink INK decreases and the number of dispersed light emitting elements ED decreases as the linear distance from the outer bank BNL decreases, it is necessary to secure a certain amount of linear distance between the outer bank BNL and the path. In one or more embodiments, the first width w1 may be 5 μm or more. In the case where the linear distance between the outer bank BNL and the path is 5 μm or more, the height of the ejected ink INK is secured to some extent, so that the number of light emitting elements ED to be aligned can be secured.

Hereinafter, other embodiments of the display device 1 will be described. In the following embodiment, the same components as those of the above-described embodiment are denoted by the same reference numerals, a description thereof will be omitted or simplified, and differences will be mainly described.

Figure 11:
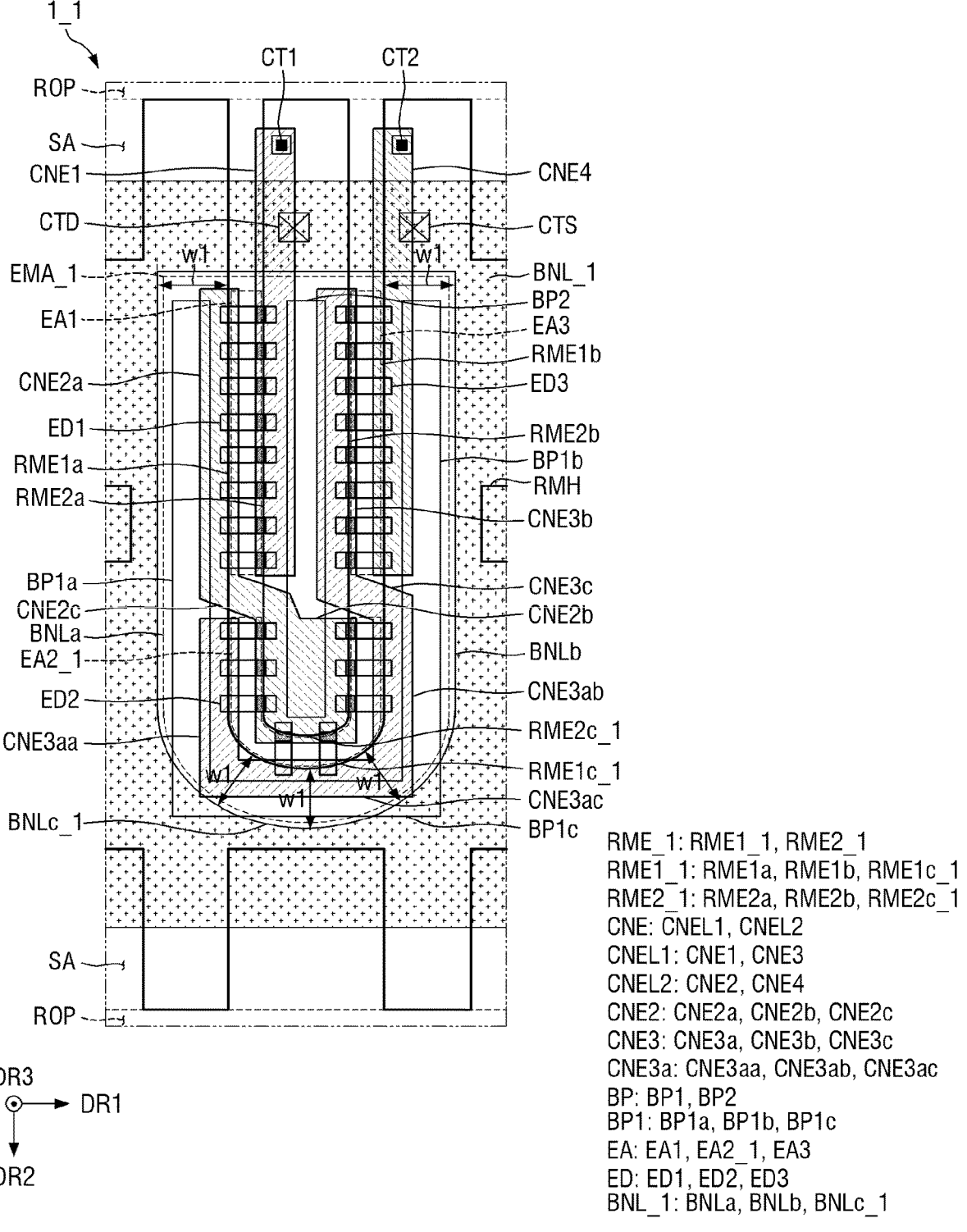
FIG. 11 is a plan view illustrating a structure of a sub-pixel according to one or more embodiments.

FIG. 11 is a plan view illustrating a structure of a sub-pixel according to one or more embodiments.

In the example shown in FIG. 11, a second portion of a second path EA2_1 formed by a first alignment electrode RME1_1 and a second alignment electrode RME2_1 of a display device 1_1 according to the present embodiment may have a curved shape.

The alignment electrode RME_1 according to the present embodiment may include the first alignment electrode RME1_1 and the second alignment electrode RME2_1.

The first alignment electrode RME1_1 may include a first electrode portion RME1a, a second electrode portion RME1b, and a third electrode portion RME1c_1. Because the descriptions of the first electrode portion RME1a and the second electrode portion RME1b are the same as those described above, a detailed description thereof will be omitted.

A third electrode portion RME1c_1 of the first alignment electrode RME1_1 may have a shape concave to one side in the second direction DR2 in the emission area EMA. For example, the third electrode portion RME1c_1 may have a curved shape with a suitable curvature (e.g., a predetermined curvature).

The second alignment electrode RME2_1 may include a first side surface RME2a, a second side surface RME2b, and a third side surface RME2c_1. Because the description of the first side surface RME2a and the second side surface RME2b are the same as described above, a detailed description thereof will be omitted.

The third side surface RME2c_1 of the second alignment electrode RME2_1 may have a shape convex to one side in the second direction DR2. For example, the third side surface RME2c_1 may have a curved shape with a suitable curvature (e.g., a predetermined curvature).

Accordingly, the third portion of the second path EA2_1, which is a space between the third side surface RME2c_1 of the second alignment electrode RME2_1 and the third electrode portion RME1c_1 of the first alignment electrode RME1_1, may have a shape concave to one side in the second direction DR2. Due to the shape described above, the second path EA2_1 may have a substantially constant width, and thus, a gap between the third side surface RME2c_1 of the second alignment electrode RME2_1 and the third electrode portion RME1c_1 of the first alignment electrode RME1_1 also becomes constant regardless of the location. Therefore, the alignment of the light emitting elements ED may be facilitated.

In addition, an outer bank BNL_1 according to the present embodiment may form an emission area EMA_1 corresponding to the shape of the third side surface RME2c_1 of the second alignment electrode RME2_1 and the third electrode portion RME1c_1 of the first alignment electrode RME1_1.

For example, a third surface BNLc_1 of the outer bank BNL_1 according to the present embodiment corresponds to the shape of the third electrode portion RME1c_1 of the first alignment electrode RME1_1 to have a shape concave to one side of the second direction DR2, and thus, the emission area EMA_1 may have a curved shape convex to one side surface in the second direction DR2. Accordingly, the linear distance between the third surface BNLc_1 of the outer bank BNL_1 and the third electrode portion RME1c_1 of the first alignment electrode RME1_1 may be constant with the first width w1 regardless of the position.

Due to the above configuration, the linear distance between the third surface BNLc_1 of the outer bank BNL_1 and the third electrode portion RME1c_1 of the first alignment electrode RME1_1 is constant regardless of the position, so that the light emitting elements ED can be evenly aligned regardless of the region.

Figure 12:
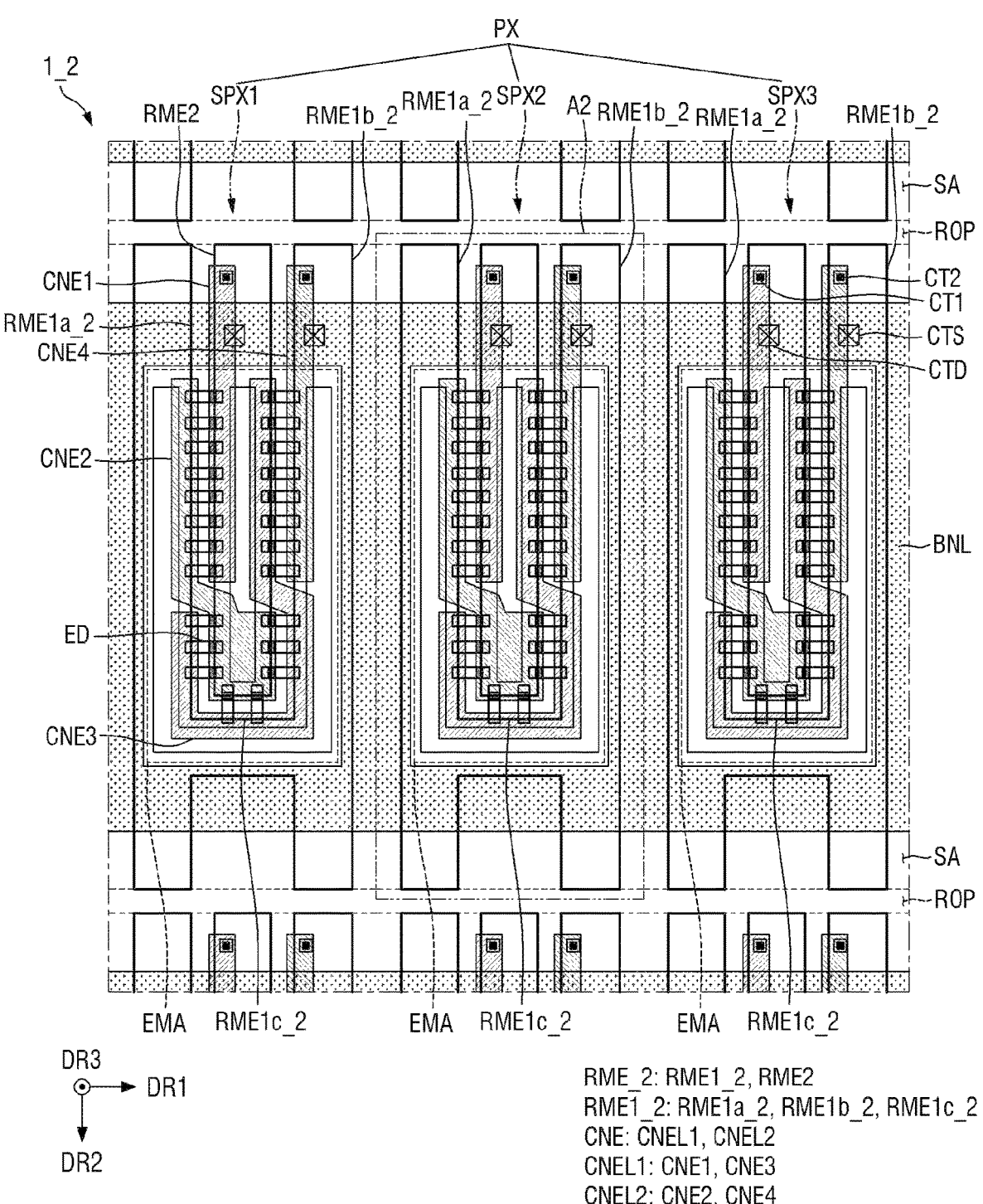
FIG. 12 is a plan view of a pixel according to one or more embodiments.
Figure 13:
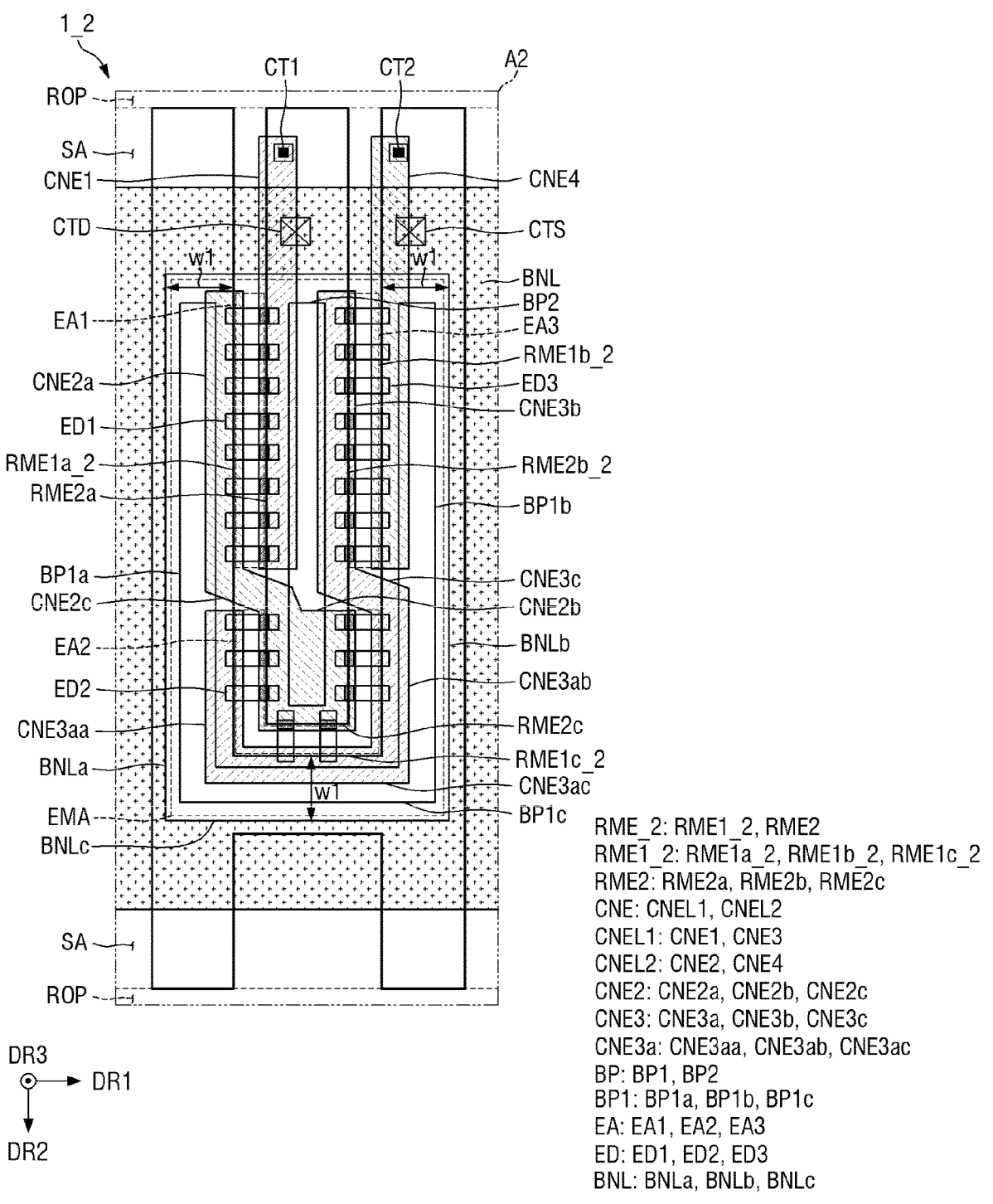
FIG. 13 is an enlarged view of an area A2 of FIG. 12.

FIG. 12 is a plan view illustrating a structure of a pixel according to one or more embodiments. FIG. 13 is an enlarged view of an area A2 of FIG. 12.

In the examples shown in FIGS. 12 and 13, an alignment electrode RME_2 of a display device 1_2 according to one or more embodiments may include a first alignment electrode RME1_2 and the second alignment electrode RME2 disposed in each of the sub-pixels SPXn.

Since the second alignment electrode RME2 according to the present embodiment is the same as the second alignment electrode RME2 according to an embodiment, a detailed description thereof will be omitted.

The first alignment electrode RME1_2 may have a U-shape surrounding the second alignment electrode RME2 in the emission area EMA of each sub-pixel SPXn.

The first alignment electrode RME1_2 may include a first electrode portion RME1a_2, a second electrode portion RME1b_2, and a third electrode portion RME1c_2. As a part of the first alignment electrode RME1_2, the first electrode portion RME1a_2, the second electrode portion RME1b_2, and the third electrode portion RME1c_2 may be integrally formed to form the first alignment electrode RME1_2.

The shapes of the first electrode portion RME1a_2, the second electrode portion RME1b_2, and the third electrode portion RME1c_2 are substantially the same as the shapes of the first electrode portion RME1a, the second electrode portion RME1b, and the third electrode portion RME1c of the display device 1 according to one or more embodiments, respectively, a detailed description thereof will be omitted.

In one or more embodiments, the first alignment electrode RME1_2 according to the present embodiment is different from the first alignment electrode RME1 of the display device 1 according to one or more embodiments in that it is disposed in each sub-pixel SPXn and spaced from each other. For example, as shown in FIG. 12, the first electrode portion RME1a_2 of the second sub-pixel SPX2 may be spaced from the second electrode portion RME1b_2 of the first sub-pixel SPX1 in the first direction DR1, and the second electrode portion RME1b_2 of the second sub-pixel SPX2 may be spaced from the first electrode portion RME1a_2 of the third sub-pixel SPX3 in the first direction DR1.

Because the process of forming the alignment electrode RME_2 is simplified by the configuration described above, the processability may be improved.

What is claimed is:

1. A display device comprising:
a bank layer defining a first light emitting area;
a first electrode in the first light emitting area;
a second electrode spaced from the first electrode and around at least a part of the first electrode in the first light emitting area; and
a light emitting element in a space between the first electrode and the second electrode,
wherein the second electrode comprises:
a first electrode portion facing a first side surface of the first electrode and forming a first separation space in the first light emitting area;
a second electrode portion facing a second side surface of the first electrode and forming a second separation space in the first light emitting area; and
a third electrode portion connecting the first electrode portion and the second electrode portion and facing a third side surface of the first electrode and forming a third separation space in the first light emitting area,
wherein the bank layer comprises:
a first surface opposing the first side surface of the first electrode;
a second surface opposing the second side surface of the first electrode; and
a third surface connecting the first surface and the second surface of the bank layer and opposing the third surface of the first electrode, and
wherein a linear distance between the first separation space and the first surface of the bank layer, a linear distance between the second separation space and the second surface of the bank layer, and a linear distance between the third separation space and the third surface of the bank layer are the same.

2. The display device of claim 1, wherein each of the linear distance between the first separation space and the first surface of the bank layer, the linear distance between the second separation space and the second surface of the bank layer, and the linear distance between the third separation space and the third surface of the bank layer is 5 μm or more.

3. The display device of claim 2, further comprising a connection electrode on the light emitting element, wherein the light emitting element comprises a first light emitting element, a second light emitting element, and a third light emitting element, each of the first light emitting element, the second light emitting element, and the third light emitting element comprising a first end portion having a first polarity and a second end portion opposite the first end portion and having a second polarity different from the first polarity, and wherein the connection electrode comprises:

a first connection electrode in contact with the first end portion of the first light emitting element;

a second connection electrode in contact with the second end portion of the first light emitting element and the first end portion of the second light emitting element;

a third connection electrode in contact with the second end portion of the second light emitting element and the first end portion of the third light emitting element; and a fourth connection electrode in contact with the second end portion of the third light emitting element.

4. The display device of claim 3, wherein the first connection electrode is configured to receive a first power voltage, and wherein the fourth connection electrode is configured to receive a second power voltage having a different potential value from the first power voltage.

5. The display device of claim 4, wherein the first connection electrode is on the first electrode, wherein the fourth connection electrode is on the second electrode portion of the second electrode, wherein the second connection electrode comprises:

a first portion on the first electrode portion of the second electrode and facing the first connection electrode;

a second portion on the first electrode; and a connection portion connecting the first portion and the second portion, and wherein the third connection electrode comprises:

a first portion around the second portion of the second connection electrode;

a second portion on the first electrode and facing the fourth connection electrode; and a connection portion connecting the first portion and the second portion.

6. The display device of claim 5, wherein the second end portion of the first light emitting element is in contact with the first portion of the second connection electrode, wherein the first end portion of the second light emitting element is in contact with the second portion of the second connection electrode, the second end portion of the second light emitting element is in contact with the first portion of the third connection electrode, and wherein the first end portion of the third light emitting element is in contact with the second portion of the third connection electrode.

7. The display device of claim 6, wherein the bank layer further defines a second light emitting area at one side of the first light emitting area, and wherein the first electrode portion of the second electrode in the first light emitting area extends to the second light emitting area.

8. The display device of claim 7, wherein the bank layer further defines a third light emitting area at an other side of the first light emitting area, and wherein the second electrode portion of the second electrode in the first light emitting area extends to the third light emitting area.

9. The display device of claim 8, wherein the first electrode portion of the second electrode further comprises a through hole between the first light emitting area and the second light emitting area and penetrating the first electrode portion of the second electrode, and wherein the second electrode portion further comprises a through hole between the first light emitting area and the third light emitting area and penetrating the second electrode portion.

10. A display device comprising:

a bank layer defining a light emitting area;

a first electrode in the light emitting area and comprising a first side surface, a second side surface, and a third side surface connecting the first side surface and the second side surface;

a second electrode spaced from the first electrode in the light emitting area to be around the first side surface of the first electrode, the second side surface, and the third side surface of the first electrode;

a first light emitting element, a second light emitting element, and a third light emitting element between the first electrode and the second electrode, each of the first light emitting element, the second light emitting element, and the third light emitting element comprising a first end portion having a first polarity and a second end portion opposite the first end portion and having a second polarity different from the first polarity; and a connection electrode on the first light emitting element, the second light emitting element, and the third light emitting element, wherein the connection electrode comprises:

a first connection electrode in contact with the first end portion of the first light emitting element;

a second connection electrode in contact with the second end portion of the first light emitting element and the first end portion of the second light emitting element;

a third connection electrode in contact with the second end portion of the second light emitting element and the first end portion of the third light emitting element; and a fourth connection electrode in contact with the second end portion of the third light emitting element.

11. The display device of claim 10, wherein the first connection electrode is configured to receive a first power voltage, and wherein the fourth connection electrode is configured to receive a second power voltage having a different potential value from the first power voltage.

12. The display device of claim 11, wherein the first connection electrode is on the first side surface of the first electrode, wherein the fourth connection electrode is on the second electrode, wherein the second connection electrode comprises:

a first portion on the second electrode and facing the first connection electrode;

a second portion on the first electrode; and a connection portion connecting the first portion and the second portion of the second connection electrode, wherein the third connection electrode comprises:

a first portion around the second portion of the second connection electrode;

a second portion on the second side surface of the first electrode and facing the fourth connection electrode; and a connection portion connecting the first portion and the second portion of the third connection electrode.

13. The display device of claim 12, wherein the second end portion of the first light emitting element is in contact with the first portion of the second connection electrode, wherein the first end portion of the second light emitting element is in contact with the second portion of the second connection electrode, wherein the second end portion of the second light emitting element is in contact with the first portion of the third connection electrode, and wherein the first end portion of the third light emitting element is in contact with the second portion of the third connection electrode.

14. The display device of claim 13, wherein the connection portion of the second connection electrode is between the first light emitting element and the second light emitting element, and wherein the connection portion of the third connection electrode is between the second light emitting element and the third light emitting element.

15. The display device of claim 14, wherein a width of the second portion of the second connection electrode is greater than a width of the first portion of the first electrode.

16. The display device of claim 12, wherein the second portion of the second connection electrode completely covers the third side surface of the first electrode and covers at least a part of the first side surface and the second side surface of the first electrode.

17. The display device of claim 16, wherein the third connection electrode comprises:

a first extension portion of the first portion facing the first side surface of the first electrode in a portion of the first electrode overlapping the second portion of the second connection electrode;

a second extension portion of the first portion facing the second side surface of the first electrode; and a third extension portion of the first portion facing the third side surface of the first electrode.

18. The display device of claim 10, wherein the second electrode comprises:

a first electrode portion adjacent to the first side surface of the first electrode in the light emitting area and forming a first separation space;

a second electrode portion adjacent to the second side surface of the first electrode in the light emitting area and forming a second separation space; and a third electrode portion adjacent to the third side surface of the first electrode in the light emitting area and forming a third separation space.

19. The display device of claim 18, wherein the bank layer comprises:

a first surface opposing the first side surface of the first electrode;

a second surface opposing the second surface of the first electrode; and a third surface opposing the third surface of the first electrode, wherein a linear distance between the first separation space and the first surface of the bank layer, a linear distance between the second separation space and the second surface of the bank layer, and a linear distance between the third separation space and the third surface of the bank layer are the same.

20. The display device of claim 19, wherein each of the linear distance between the first separation space and the first surface of the bank layer, the linear distance between the second separation space and the second surface of the bank layer, and the linear distance between the third separation space and the third surface of the bank layer is 5 $\mu$m or more.

* * * * *